(12) United States Patent
Händel et al.

(10) Patent No.: US 6,407,685 B1
(45) Date of Patent: *Jun. 18, 2002

(54) FULL SCALE CALIBRATION OF ANALOG-TO-DIGITAL CONVERSION

(75) Inventors: Peter Händel, Stockholm; Mikael Skoglund, Tullinge; Mikael Pettersson, Uppsala, all of (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,803

(22) Filed: Jun. 19, 2000

Related U.S. Application Data

(63) Continuation-in-part of application No. 09/196,811, filed on Nov. 20, 1998, now Pat. No. 6,127,955.

(51) Int. Cl.[7] .............................. H03M 1/10; H03M 1/12
(52) U.S. Cl. ........................ 341/120; 341/118; 341/155
(58) Field of Search ............................... 341/118, 119, 341/120, 121

(56) References Cited

U.S. PATENT DOCUMENTS

| | | | | |
|---|---|---|---|---|
| 4,535,319 A | * | 8/1985 | Penney ........................ | 341/118 |
| 4,736,189 A | | 4/1988 | Katsumata et al. .......... | 340/347 |
| 4,903,023 A | | 2/1990 | Evans et al. ................. | 341/120 |

(List continued on next page.)

FOREIGN PATENT DOCUMENTS

WO     WO 00/31876     6/2000

OTHER PUBLICATIONS

Standard Search Report for RS 102465US Completed on Feb. 19, 1999, filed Feb. 22, 1999, EPX.

Digital–Domain Calibration of Multistep Analog–to–Digital Converters, by Seung–Hoon Lee and Bang–Sup Song, Senior Member, IEEE; IEEE Journal of Solid–State Circuits; vol. 27, No. 12, Dec. 1992, pp. 1679–1688.

Predictive Digital Filtering of Sinusoidal Singals, by Peter Händel, IEEE IEEE Transactions on Signal Processing, vol. 46, No. 2, Feb. 1998, pp. 364–374.

Single–Tone Parameter Estimation from Discrete–Time Observations by David C. Rife, Senior Member, IEEE, and Robert R. Boorstyn, Member, IEEE, IEEE Transactions on Information Theory, vol. IT–20, No. 5, Sep. 1974, pp. 591–598.

Digital Signal Processing–Principles, Algorithms and Applications by J.G. Proakis and D.M. Manolakis, Prentice Hall International, Third Edition, 1996, Chapter 9.2, pp. 748–762.

(List continued on next page.)

*Primary Examiner*—Peguy JeanPierre
*Assistant Examiner*—Jean Bruner Jeanglaude
(74) *Attorney, Agent, or Firm*—Jenkens & Gilchrist, P.C.

(57) ABSTRACT

Methods and arrangements enable ADCs to be calibrated from reference signals with unknown parameters and/or with amplitudes that exceed the dynamic range of the ADCs. A given analog reference signal s(t) is supplied to an ADC. The output (x(k)) of the ADC is used by calibration logic to estimate at least one parameter of the reference signal. A FIR filter accepts as input the x(k) signals and outputs an estimate (ŝ(k)) as the sampled instances of the s(t) signal. A reconstruction table is created that approximates the analog input signal in the digital domain using the knowledge of the analog input signal waveform type. The actual ADC outputs are compared to the values in the reconstruction table to produce a correction table for calibration. In an alternative embodiment, calibration logic interpolates the output (x(k)) of the ADC to reconstruct clipped portion(s) of the input analog reference signal s(t) when the amplitude of the input analog reference signal s(t) exceeds the full swing of the ADC. The FIR filter can thereafter use the reconstructed signal from the interpolation.

26 Claims, 8 Drawing Sheets

U.S. PATENT DOCUMENTS

| | | | | | |
|---|---|---|---|---|---|
| 4,903,024 | A | * | 2/1990 | Evans et al. | 341/120 |
| 5,101,205 | A | * | 3/1992 | Yasuda | 341/118 |
| 5,266,951 | A | | 11/1993 | Kuegler et al. | 341/120 |
| 5,361,067 | A | | 11/1994 | Pinckley | 341/120 |
| 5,499,027 | A | | 3/1996 | Karanicolas et al. | 341/120 |
| 5,644,308 | A | | 7/1997 | Kerth et al. | 341/120 |
| 5,754,973 | A | * | 5/1998 | Akune | 704/205 |
| 5,771,012 | A | | 6/1998 | Shu et al. | 341/118 |
| 5,793,319 | A | | 8/1998 | Ard | 341/120 |
| 5,861,828 | A | | 1/1999 | Opris | 341/120 |
| 5,990,814 | A | | 11/1999 | Croman et al. | 341/118 |
| 6,127,955 | A | * | 10/2000 | Handel et al. | 341/120 |

OTHER PUBLICATIONS

Least Squares Quantization in PCM by Stuart P. Lloyd, IEEE Transactions on Information Theory, vol. IT–28, No. 2, Mar. 1982, pp. 129–137.

1989 IEEE International Symposium on Circuits and Systems; Real–Time Equalization of A/D Converter Nonlinearities by D. Moulin; Portland, OR, May 8–11, 1989, vol. 1, No. SYMP. 22 May 8, 1989, pp. 262–267, XP000131234; Institute of Electrical and Electronics Engineers.

Standard Search Report for RS 105431US Completed on Dec. 11, 2000, filed Dec. 14, 2000, EPX.

* cited by examiner

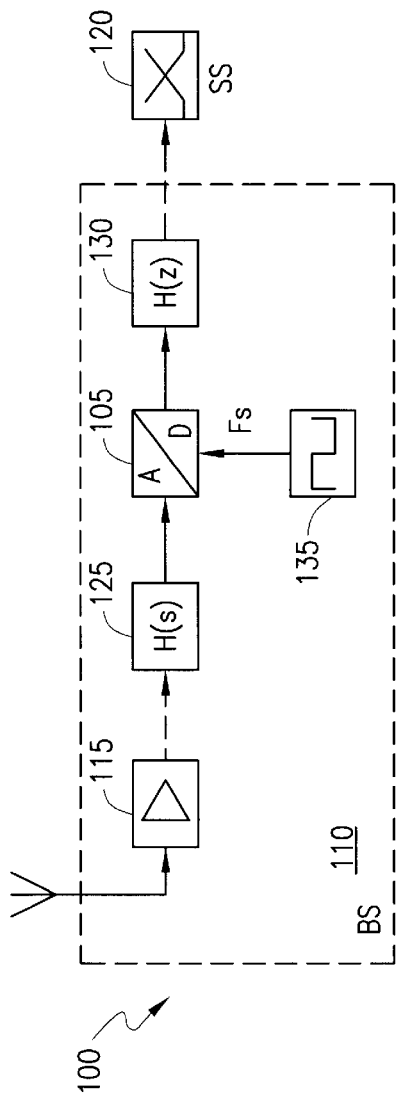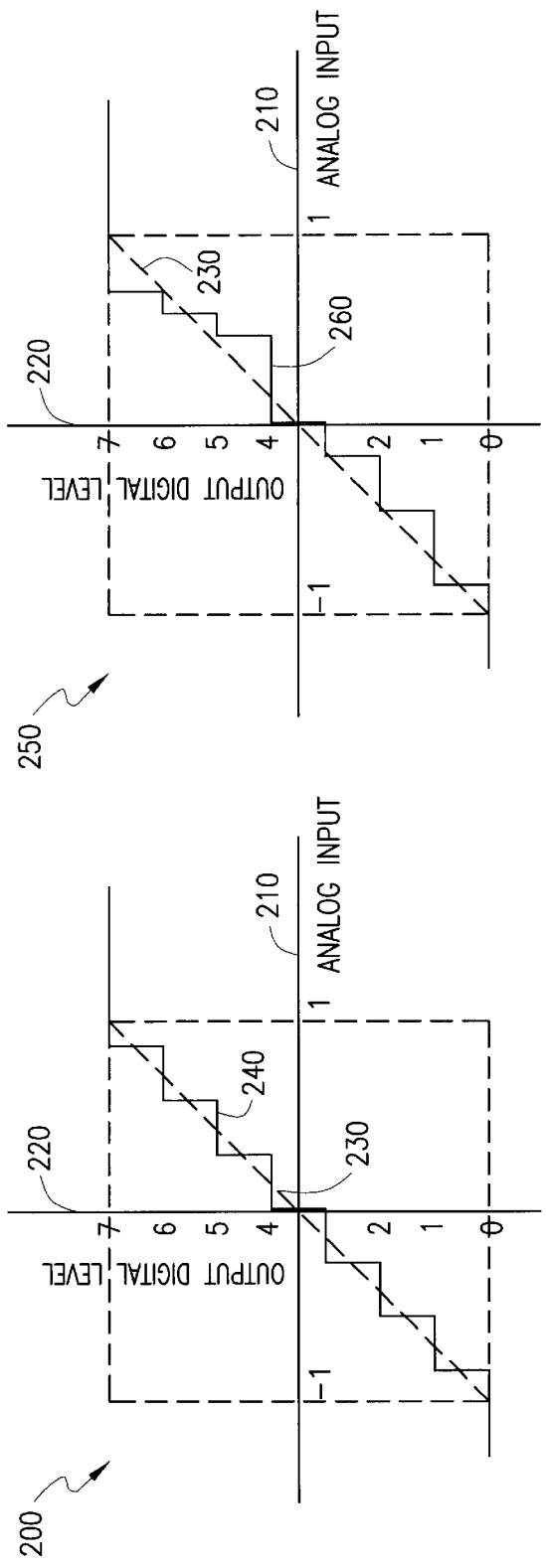

FULL SCALE CALIBRATION OF ANALOG-TO-DIGITAL CONVERSION

CROSS-REFERENCE TO RELATED APPLICATION

This Application is a Continuation-in-Part of co-pending U.S. application Ser. No. 09/196,811, filed on Nov. 20, 1998 is now U.S. Pat. No. 6,127,955. This U.S. application Ser. No. 09/196,811 is hereby incorporated by reference in its entirety herein.

BACKGROUND OF THE INVENTION

1. Technical Field of the Invention

The present invention relates in general to the field of analog-to-digital converters (ADCs), and in particular, by way of example but not limitation, to digital calibration of ADCs in which the calibration may be accomplished with dynamic estimation of reference signals that have unknown parameters and/or that have amplitude swings that exceed the full swing of the ADC.

2. Description of Related Art

The natural world operates in an analog domain, but information signals (voice, data, etc.) may frequently be processed, transmitted, or otherwise manipulated more efficiently in the digital domain. The conversion from the analog domain to the digital domain is accomplished with ADCs. An ADC receives as input an analog signal and produces as output a digital signal. However, some information present in the analog signal is necessarily lost during the conversion process even if an ADC is operating in an ideal manner. Unfortunately, real-world ADCs do not operate in an ideal manner. Consequently, the digital output of a real-world ADC does not track the analog input even as accurately as an ideal ADC.

It is therefore beneficial to make and/or tune real-world ADCs to approximate ideal ADCs. Techniques have been developed to calibrate real-world ADCs so as to modify their performance to emulate ideal ADCs as closely as possible. For example, ADCs are traditionally calibrated using high precision digital voltmeters to characterize the errors that result from digitizing static or slowly varying analog reference voltages. The outcome from this static testing forms the basis for a hardware or software implemented calibration scheme. Another method of conventional ADC calibration is the use of a sinusoidal reference signal. The reference is sampled, and estimations of the ideal sample values are calculated. These estimations are calculated using a minimum squared error criterion that requires knowledge of the frequency of the calibration signal. The errors (i.e., the difference between the estimated values and the actual sampled values output by the ADC being calibrated) are then used to build a correction table. The correction table may subsequently be used to modify sampled values of actual (e.g., non-calibration, functional, etc.) analog input signals.

Efficient calibration schemes require that the reference signal be dynamically estimated on a sample-by-sample basis during the ADC calibration period(s). No method currently exists for dynamic estimation of a reference signal (e.g., a calibration signal) with one or more unknown parameters (e.g., frequency, phase, etc.) during an ADC calibration. Hence, existing calibration procedures rely on accurate and costly signal generators and/or precise and expensive measuring components.

The Parent Application (U.S. application Ser. No. 09/196,811) of this Continuation-in-Part Application remedies the above-described problems that existed in previous calibration procedures, as explained hereinbelow. In fact, the deficiencies of the prior art are overcome by the methods and arrangements of the Parent Application. For example, as theretofore unrecognized, it would be beneficial to enable calibration of ADCs using a reference signal of a given waveform type, but with unknown parameters. In fact, it would be beneficial if such a calibration procedure could also be accomplished in real-time using overflow processing capacity of a system in which a single ADC is employed. The invention of the Parent Application provides these benefits.

However, other problems still exist that are not solved by the invention of the Parent Application. For example, using an input signal (e.g., a sine wave) that has an amplitude that does not equal the full scale input range of the ADC can result in a poor calibration. If the amplitude of the input signal is less than the full swing of the ADC, then all quantization levels of the ADC will not be excited; consequently, the ADC will have a loss in performance that results from not being fully calibrated. If, on the other hand, the amplitude of the input signal is greater than the full swing of the ADC, then the calibration of the ADC can be erroneous. Furthermore, due to the fact that nonlinearity and offset errors are unique to each ADC specimen, exactly matching the amplitude of the input signal to the full swing of the ADC is difficult and/or expensive.

SUMMARY OF THE INVENTION

The deficiencies of the prior art are overcome by the methods and arrangements of the present invention. For example, as heretofore unrecognized, it would be beneficial to enable calibration of ADCs using a reference signal that exceeds the full swing of the ADC but does not cause an erroneous calibration. In fact, it would be beneficial if such a calibration procedure could also be accomplished in real-time using overflow processing capacity of a system in which an ADC is employed.

These and other benefits are achieved by the methods and arrangements of the present invention, which may optionally be used in synergistic conjunction with the invention of the Parent Application. Additional benefits of the invention of this Continuation-in-Part Application may therefore be achieved by combining the mutual inventive concepts. To that end, in the overall present invention, ADCs may be calibrated using an analog calibration signal that is easy to generate (e.g., a sinusoidal signal). The present invention, however, is equally applicable to other calibration signals as well, such as saw-tooth and triangle waves. Advantageously, a calibration scheme in accordance with the principles of the present invention is independent of the actual parameters of the calibration signal (e.g., amplitude, frequency, initial phase, etc. for a sinusoidal-type calibration signal). Relevant parameters of an applied calibration signal that are needed for a calibration are calculated from the converted digital data.

In one embodiment, the present invention may be composed of several exemplary operational components in order to enable the calibration of an ADC without knowing all of the parameters of a calibration signal. An estimator calculates estimates of relevant parameter(s) (e.g., the frequency) of a calibration signal of a known waveform type from the digital outputs of an ADC. A filter utilizes the temporal information and at least one variable related to the estimated parameter(s) of the calibration signal to reconstruct the calibration signal in the digital domain. Also, a table generator calculates correction table entries from the ADC output and the reconstructed calibration signal.

In another embodiment, the present invention may be composed of several exemplary operational components in order to enable the calibration of an ADC using a calibration signal that exceeds the dynamic range of the ADC. An estimator calculates estimates of relevant parameter(s) (e.g., the frequency) of a calibration signal of a known waveform type from the digital outputs of an ADC. A non-linear processor (NLP) may utilize at least one variable related to one or more of the estimated parameter(s) of the calibration signal to reconstruct (e.g., interpolate the clipped portions of) the calibration signal in the digital domain, regardless of whether the calibration signal exceeds the ADC's full scale input range. A filter utilizes at least one variable related to the estimated parameter(s) of the calibration signal to reconstruct the calibration signal in the digital domain from the output of the NLP. Also, a table generator calculates correction table entries from the ADC output and the reconstructed calibration signal, optionally truncated to the ADC's output range by a non-linear function (NLF). For yet another embodiment, it should be noted that the estimator, for example, need not be included whereby the filter and the NLP can use a known parameter(s) of the calibration signal instead of an estimated one(s).

The above-described exemplary components may be implemented in either hardware, software, or some combination thereof. other principles of the present invention, including alternative specific embodiments, are further explained, for example, by the detailed description and related drawings.

The technical advantages of the present invention include, but are not limited to, the following. It should be understood that particular embodiments may not involve any, much less all, of the following exemplary technical advantages.

An important technical advantage of the present invention is that it enables ADC calibration to be fully implemented in software.

Another important technical advantage of the present invention is that it provides robustness against variations in an analog calibration signal.

Yet another important technical advantage of the present invention is the ability to improve the efficiency of ADC calibration; consequently, fewer samples of the calibration signal are required.

Yet another important technical advantage of the present invention is that the whole range of the ADC may be calibrated using a signal that exceeds the ADC's dynamic range.

Yet still another important technical advantage of the present invention is that the quality constraints on the calibration signal may be relaxed because the calibration signal need not have a well defined amplitude, as long as it exceeds the ADC's dynamic range.

Yet still another important technical advantage of the present invention is that using a sinusoidal signal that exceeds the dynamic range of the ADC provides for a more uniform excitation of the ADC's levels, which results in improved Linearity of lower ADC levels.

A still further important technical advantage of the present invention is that the NLP and the filter may be combined to create a more implementation efficient solution using the linear portion of the NLP as a filter.

The above-described and other features of the present invention are explained in detail hereinafter with reference to the illustrative examples shown in the accompanying drawings. Those skilled in the art will appreciate that the described embodiments are provided for purposes of illustration and understanding and that numerous equivalent embodiments are contemplated herein.

BRIEF DESCRIPTION OF THE DRAWINGS

A more complete understanding of the method and system of the present invention may be had by reference to the following detailed description when taken in conjunction with the accompanying drawings wherein:

FIG. 1 illustrates an exemplary ADC environment in which the present invention may be advantageously implemented;

FIG. 2A illustrates an exemplary analog input signal versus digital output signal graph of an ideal ADC;

FIG. 2B illustrates an exemplary analog input signal versus digital output signal graph of a practical ADC;

DETAILED DESCRIPTION OF THE DRAWINGS

Figure 3A:
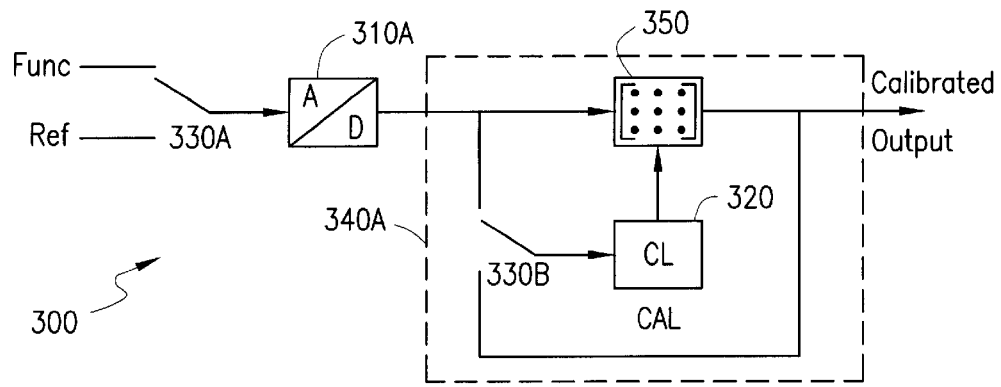
FIG. 3A illustrates an exemplary application of calibration in accordance with the present invention.

In the following description, for purposes of explanation and not limitation, specific details are set forth, such as particular circuits, logic modules (implemented in, for example, software, hardware, firmware, some combination thereof, etc.), techniques, etc. in order to provide a thorough understanding of the invention. However, it will be apparent to one of ordinary skill in the art that the present invention may be practiced in other embodiments that depart from these specific details. In other instances, detailed descriptions of well-known methods, devices, logical code (e.g., hardware, software, firmware, etc.), etc. are omitted so as not to obscure the description of the present invention with unnecessary detail.

A preferred embodiment of the present invention and its advantages are best understood by referring to FIGS. 1–12 of the drawings, like numerals being used for like and corresponding parts of the various drawings.

Referring now to FIG. 1, an exemplary ADC environment in which the present invention may be advantageously implemented is illustrated. An ADC 105 is shown as part of a telecommunications system environment 100. Specifically, environment 100 includes a receiver 115 of a mobile radio system base station (BS) 110 in communication with a telephone switching system (SS) 120 (e.g., a node in a wireline system). The receiver 115 provides an analog incoming signal (e.g., transmitted from a mobile station (MS) (not shown) of the mobile radio system) to an analog filter H(s) 125 that limits the bandwidth of the ADC 105 analog input signal to one Nyquist zone. The digital output signal of the ADC 105 is connected to a digital filter H(z) 130, which may further filter the incoming signal. The output of the digital filter H(z) 130 may be processed further and forwarded to the SS 120.

The ADC 105 converts a time continuous and amplitude continuous signal to a time discrete and amplitude discrete signal. The output data rate of the ADC 105 is controlled by a sampling clock generator 135 with frequency $F_s$, which is also the data rate of the ADC output. The ADC 105 may optionally include a sample and hold (S/H) circuit (not shown in FIG. 1), which holds an instantaneous value of the (analog filtered) analog input signal, which is received from the analog filter H(s) 125, at selected instants of time so that the ADC 105 may sample them.

The ADC 105 quantizes each sampled analog input signal into one of a finite number of levels and represents (e.g., codes) each level into a bit pattern that is delivered as the digital output at the rate of the sampling clock generator 135. The digital output of the ADC 105 is composed of an exemplary number of eight (8) bits. Hence, 256 levels may be represented. The telecommunications system environment 100 will be used to describe a preferred embodiment of the present invention. However, it should be understood that the principles of the present invention are applicable to other ADC environments, such as video implementations, delta modulation, a flash ADC, an integrating ADC, pulse code modulation (PCM), a sigma-delta ADC, and a successive approximation ADC.

Referring now to FIG. 2A, an exemplary analog input signal versus digital output signal graph of an ideal ADC is illustrated. The ideal ADC graph is shown generally at 200. The abscissa axis 210 represents the analog input, and the ordinate axis 220 represents the level of digital output. The dashed diagonal line 230 represents a linear, non-quantized output response for the analog input signal; it is used here as an aiming line for the quantized output. The corresponding output of the ideal ADC is represented by the stair-stepped line 240. As can be seen, the ideal ADC digital output 240 tracks the analog input 230 as accurately as possible with a given number of quantization levels (e.g., resolution) and sampling rate.

Referring now to FIG. 2B, an exemplary analog input signal versus digital output signal graph of a practical ADC is illustrated. The practical ADC graph is shown generally at 250. The dashed diagonal line 230 is again shown as an aiming line for ideal mid-step transition of the digital output. The corresponding output of the practical ADC is represented by the roughly stair-stepped line 260. As can be seen, the practical ADC digital output 260 does not track the analog input 230 as accurately as does the ideal ADC (of FIG. 2A) with the same given number of quantization levels and sampling rate. Thus, it can be seen that the effective number of bits $b_{EFF}$ of a b-bit ADC may differ from the actual number of bits (b) due to errors (e.g., offset errors, gain errors, and linearity errors). The ADC calibration principles of the present invention advantageously ameliorate these various error conditions.

Application of the ADC calibration principles of the present invention provides many advantages over conventional approaches. For example, robustness against variations in the analog calibration signal is provided. There is no need for highly-stable signal generators because the present invention calculates relevant parametrical information from quantized samples of the calibration signal utilizing prior knowledge of the waveform type. The calibration signal may be generated by a low-complexity, low-precision (but spectrally pure) local oscillator included in the system using the ADC (e.g., the system may be an integrated circuit (IC), BS, etc.). The present invention allows for a design using two ADCs that switches between reference and functional input signals, where one ADC is being calibrated while the other is running functionally. Using this solution, the calibrated ADC(s) may be sensitive to temperature drift without requiring the cessation of functional data conversion while implementing repetitive calibration.

Another exemplary advantage of the present invention is increased efficiency as compared to conventional solutions. Because the filter (as explained further below) yields a better estimation of the reference signal than prior methods, fewer samples of the reference signal are needed for calibration. Additionally, the calibration scheme may be fully implemented in software. If the system the ADC is connected to has sufficient overflow capacity, then no additional digital signal processing (DSP) resources (e.g., hardware, processing cycles, etc.) are needed. In principle, the calibration may be made transparently during normal operation and delayed by only a memory access by utilizing, for example, a known pilot, as explained further below. The correction table may therefore be trained incrementally with short bursts of samples from the pilot tone used as a reference signal, thus allowing for a design using only one ADC, which is alternately connected to the reference signal and calibrated Incrementally during known intermissions of the incoming functional signal.

A pilot is a signal which stands apart from the information portion of the overall signal channel, but is carried by the same physical transmission medium. The pilot may occupy just one frequency in the utilized signal band (a so-called pilot tone), and the information may be spread in frequency to the side or around the pilot, but not on the same frequency as the pilot. A pilot is often used to adjust the system to carry the information with as high a quality as possible. Because the pilot has well-known characteristics, it may be measured and used to adjust signal level, synchronize clocks, etc., regardless of the information carried on the channel. In accordance with the principles of the present invention, the pilot signal, which may already be present in the relevant system for other purposes, may be used as a reference signal to calibrate the ADC.

A still further advantage provided by application of the principles of the present invention is that the calibration scheme adapts to the reference signal, requiring knowledge of the waveform type only. This allows for both a calibration procedure using several different frequencies and a design using an extended correction table. The correction table addressing is then extended with addresses depending upon the difference between the value of the previous sample and that of the current sample. This corrects the dynamic aspect of the errors in the ADC. Moreover, improvement of the linearity may be enhanced still further by preloading the correction table and using the output thereof for the calibration scheme. Thus, the calibrator becomes a feedback system. The improvement is due, at least in part, to the more-accurate amplitude estimation of the reference signal.

Referring now to FIG. 3A, an exemplary application of calibration in accordance with the present invention is illustrated. An ADC 310A and calibrator 340A are shown generally at 300. The ADC 310A may receive an analog functional input signal, and the calibrator 340A produces a digital calibrated output signal. The ADC 310A may be, for example, equivalent to the ADC 105 (of FIG. 1), and the calibrator 340A may include a correction table 350. When the ADC 310A is to be processing an incoming functional signal, a switch 330A is connected to the functional signal, and a switch 330B need not be connected to the output of the ADC 310A. However, when the functional signal is engaged in a known intermission, for example, the switch 330A is connected to the reference signal, and the switch 330B connects the output of the ADC 310A to the calibration logic (CL) 320. The CL 320 may produce correction table outputs for the correction table 350. In this manner, the speed of the CL 320 of the present invention enables real-time calibration with only a single ADC 310A. It should be understood that the switch 330B may alternatively be part of the calibrator 340A.

Thus, the switch 330A serves to switch between the functional operating mode and the calibration operating mode. The switch 330B, on the other hand, also enables a feedback system to be activated during calibration. The calibration procedure may therefore be accomplished in two phases. In the first phase, the switch 330B is connected to the ADC 310A output. When the correction table 350 has been trained, the switch 330B is connected to the output of the correction table 350, which enables a finer tuning of the table. The ADC 310A and the calibrator 340A of 300, for example, may benefit from calibration using a pilot tone. For example, if there is a pilot tone with an amplitude using most of the ADC 310A input range on the functional signal and if there exists a known intermission in the information carrying part of the spectrum, then this intermission can be used for ADC calibration using the pilot as a calibrating reference.

Figure 3B:
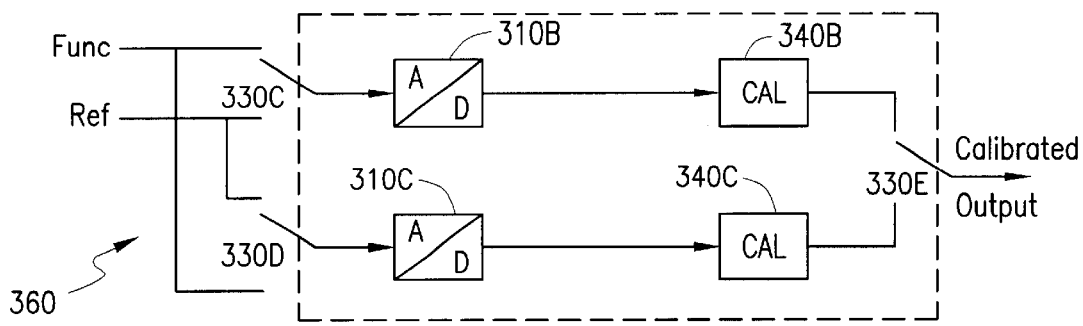
FIG. 3B illustrates another exemplary application of calibration in accordance with the present invention.

Referring now to FIG. 3B, another exemplary application of calibration in accordance with the present invention is illustrated. The present invention also enables real-time calibration with two ADCs as shown generally at 360. A reference signal and a functional signal are alternately input to a pair of ADCs 310B and 310C via switches 330C and 330D, respectively. While one is receiving the reference signal, the other is receiving and operating on the functional signal. ADC 310B and 310C forward their outputs as inputs to calibrators 340B and 340C, respectively. Switch 330E selects, for providing as the calibrated output, the forwarded digital signal that corresponds to the analog functional input signal. In this manner, calibration may be constantly in process, if desired. Advantageously, this two-ADC exemplary application enables, during a normal calibration operation, calibration to account for drift and changes during the normal operation.

It should be noted that the calibration resources may be shared, except for the correction table 350. In other words, a single calibrator 340 may alternatively receive the output of the ADCs 310B and 310C (e.g., by means of a switch) (not shown). The three switches 330C, 330D, and 330E may be synchronized. The switch transition is a fraction of the sampling period so that functional converted data passing through the system is not interrupted. In the exemplary application 360, the ADCs 310B and 310C should not have an internal delay in order for all the switches to be in the same phase. This may be solved, however, with a delay of the output switch 330E (not explicitly shown).

Figure 4A:
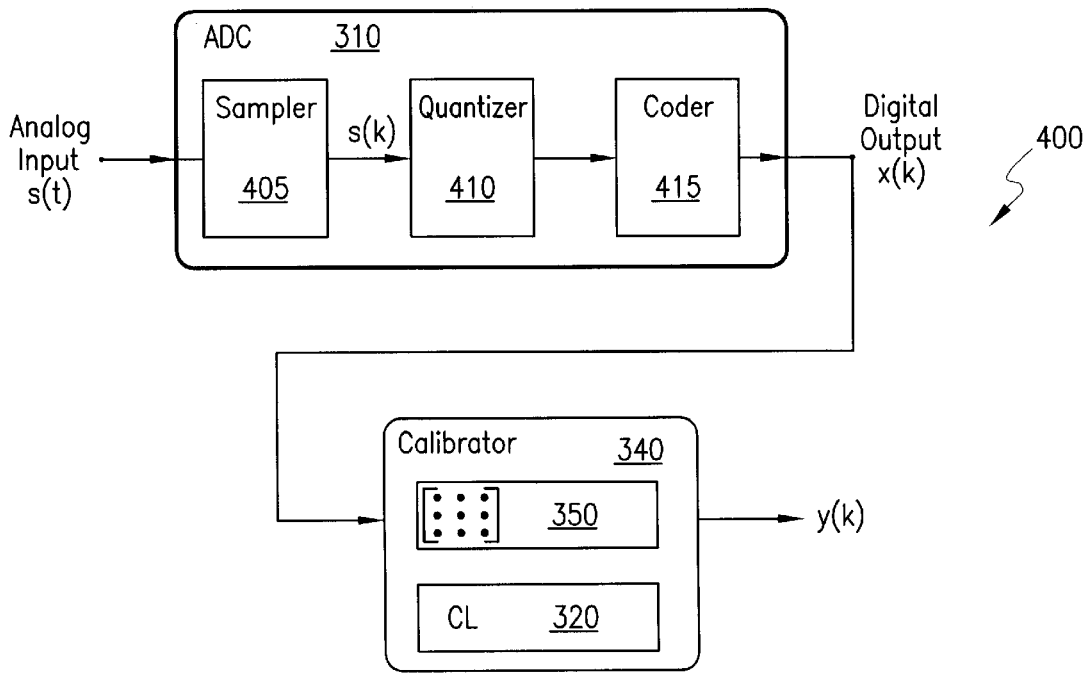
FIG. 4A illustrates an exemplary ADC and an associated calibrator with selected signals denoted in accordance with the present invention.

Referring now to FIG. 4A, an exemplary ADC and an associated calibrator are illustrated with selected signals denoted in accordance with the present invention. An exemplary ADC 310 and an exemplary calibrator 340 are shown generally at 400. The analog input signal s(t) (e.g., an airborne radio wave analog voice signal emanating from an MS transmitter (not shown), received at the receiver 115 (of FIG. 1), and frequency downconverted and filtered inside the BS 110) is supplied to the ADC 310. The ADC 310 may correspond to, for example, the ADC 105 of the BS 110 (of FIG. 1). It should be understood that the ADC 310 (and hence the ADC 105) may include the calibrator 340.

Continuing with FIG. 4A, the ADC 310 may include, for example, a sampler 405, a quantizer 410, and a coder 415. It should be understood, however, that the present invention is applicable to other ADC designs. The sampler 405 samples the incoming analog input signal s(t) and produces the time discrete sampled signal s(k), which is forwarded to the quantizer 410. The signal is then converted to the digital output x(k) by the quantizer 410 and the coder 415. The digital output x(k) is supplied to the calibrator 340, which includes the correction table 350 and the CL 320. The calibrator 340 then produces the calibrated digital signal y(k).

Figure 4B:
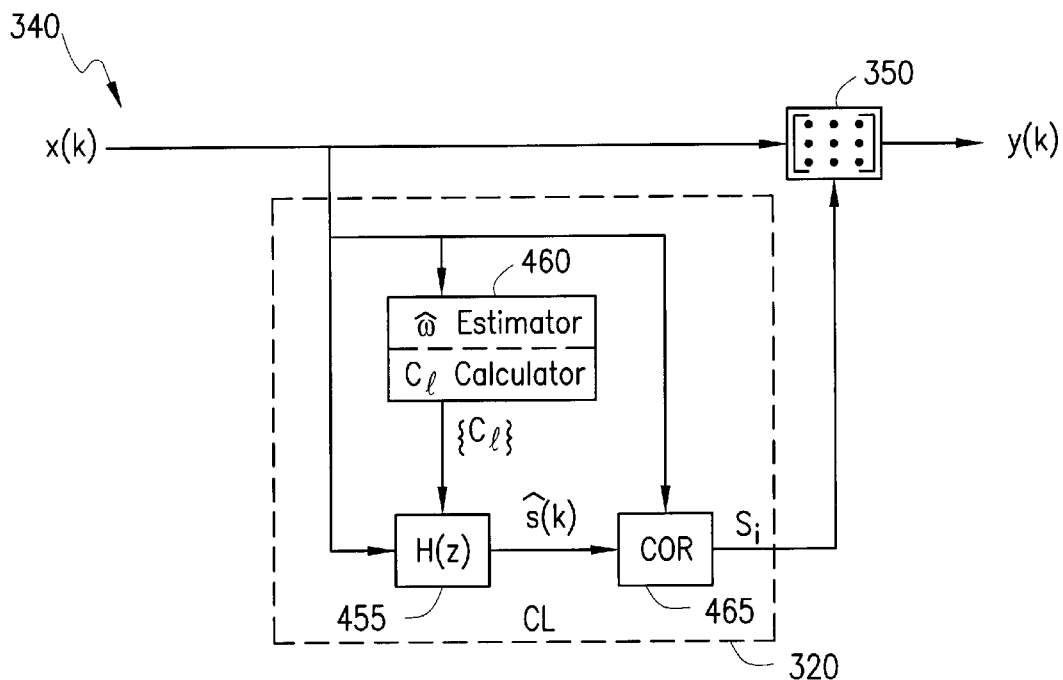
FIG. 4B illustrates exemplary details of an embodiment of calibration logic in accordance with the present invention.

Referring now to FIG. 4B, exemplary details of an embodiment of calibration logic in accordance with the present invention are illustrated. The calibrator 340 is shown receiving the digital output signal x(k) of the ADC 310 (of FIG. 4A) and producing the calibrated digital signal y(k). The calibrator 340 includes the correction table 350 and the CL 320. The digital output signal x(k) is supplied to three exemplary components of the CL 320, which are described in mathematical detail below. First, the digital output signal x(k) is supplied as an input to an estimator/calculator 460. The estimator/calculator 460 (i) estimates at least one parameter (e.g., the frequency ω) relating to the analog input reference signal s(t) and (ii) calculates coefficients (e.g., the coefficients $c_i$). Second, the digital output signal x(k) is supplied as an input (along with the coefficients $c_i$) to a finite impulse response (FIR) filter 455. The FIR filter 455 produces an estimate of s(k) (e.g., ŝ(k)), where s(k) may, for example, correspond to the output of the sampler 405 (of FIG. 4A). It should be noted that other filter types may alternatively be used. For example, an Infinite Impulse Response (IIR) filter may be used in place of the FIR filter 455.

Third, the correction calculator 465 also receives the digital output signal x(k) as an input. The correction calculator 465 computes table entries (e.g., the values of $s_i$) for the correction table 350 using the digital output signal x(k) along with the calculated ŝ(k) from the FIR filter 455. During calibration operation mode, the digital output signal x(k) is used to address the correction table 350, and the output of the correction table $s_i$ is the data written/stored to the table entry for that address. The correction table 350 may be, for example, stored in a memory (e.g., a random access memory (RAM) or a serial access memory (SAM)). It should be understood that the correction table 350 need not be in tabular form, for it may be organized into any convenient data structure.

During functional operation mode, the digital output signal x(k) continues to be used to address the correction table 350, but the value of the table entry at that address is read/retrieved and then output as the variable y(k). Hence, the digital output signal x(k) is passed through the correction table 350 in both functional and calibration operation modes. The correction table 350 is preferably initialized with $s_i=x_i$ for every input level (i=0, . . . , M−1) before functional use of the y(k) data and before any calibration (such initialization is not explicitly shown). The calibration may thus be performed later when a scheduled calibration phase occurs in the system.

Each of the functional units (components) shown in the calibrator 340 are described more fully in mathematical form below. It should be understood that the FIR filter 455, the estimator/calculator 460, and the correction calculator 465 need not be discrete electronic hardware units. Each may alternatively be implemented (either fully or partially) in software using, for example, a general purpose DSP. Furthermore, each may be implemented using excess computing capacity in whatever system (e.g., a BS) in which the calibrator 340 and the ADC 310 are being employed. Moreover, each may be implemented in either hardware, software, firmware, etc., or some combination thereof and/or share resources such as memory and/or processor cycles. It should be further understood that the calibrator 340 may be incorporated as part of the ADC 310.

Figure 4C:
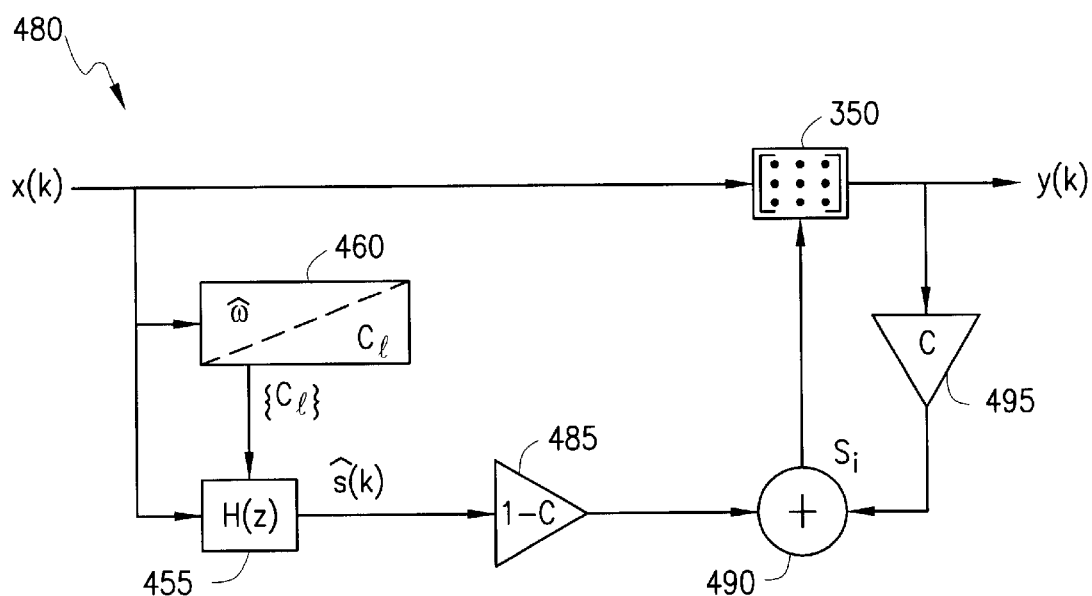
FIG. 4C illustrates exemplary details of another embodiment of calibration logic in accordance with the present invention.

Referring now to FIG. 4C, exemplary details of another embodiment of calibration logic in accordance with the present invent on are illustrated. The exemplary details of this calibration logic embodiment are designated generally by 480 and are specially targeted for implementations in which the number of calibration samples may be limited. In the calibrator 480, the correction calculator 465 (of the calibrator 340 of FIG. 4B) is replaced by a "(1−C)" multiplier 485, a summer 490, and a "C" multiplier 495, which forms a feedback loop from the output of the correction table 350. The input $s_i$ to the correction table 350 therefore becomes the sum of $Cs_i$ and $(1-C)\hat{s}(k)$. Calibrator 480 will likewise be explained in greater mathematical detail below.

Multiple schemes have previously been proposed in order to calibrate ADCs. In fact, a calibration scheme has recently been proposed that works in the digital domain only in S.-P. Lee and B.-S Song, "Digital-domain calibration of multistep analog-to-digital converters", IEEE Journal on Solid-State Circuits, Vol. 27, No. 12, pp. 1679–1688, 1992, which is hereby incorporated by reference in its entirety herein. One drawback with a method such as the one in Lee and Song's article is that it requires accurate signal generators and measurement devices to measure the code errors.

In contradistinction, the calibration scheme for ADCs in accordance with the present invention does not require such accurate signal generators and measurement devices. The scheme may be implemented fully digitally and completely in software. Furthermore, it does not require internal calibration circuitry. The calibration scheme does entail, on the other hand, a calibration signal connected to the ADC input. It also may include the storing of code errors directly in memory; consequently, the normal conversion is not slowed by error calculations.

The calibration procedure utilizes a known waveform as the calibration signal, such as a sine wave signal, a sum of several sine wave signals, a saw-tooth signal, a triangle wave signal, etc. In an exemplary embodiment that is described below, the calibration scheme for sinusoidal calibration signals is described, but it should be understood that other waveform types may be employed. The scheme may be decomposed into the following exemplary functional blocks, each of which is described in further detail below: First is a processor for estimating the frequency of the analog input s(t), where the estimate $\hat{\omega}$ is computed from the quantized output x(k) of the ADC. Second is a linear time invariant FIR filter having as input the output x(k) of the ADC, such that characteristics of the filter include coefficients which are set to minimize the noise gain. The filter output $\hat{s}(k)$ is a reconstruction of the analog calibration signal at the given sampling instants (in principle, a continuous-amplitude discrete-time signal) And, a third functional block is a processor for computing an updated reconstruction table in dependence upon x(k) and $\hat{s}(k)$ A derivation of a calibration scheme in accordance with the present invention is summarized in Table 1.

TABLE 1

Calibration scheme based on:
N quantized values of the sampled calibration signal
s(k) (e.g., {x(0), . . . , x(N − 1)} where $x(k) = Q_b[s(k)]$).

1. Calculate an estimate $\hat{\omega}$ of the calibration frequency from {x(0), . . . , x(N − 1)}. An estimate $\hat{\omega}$ is given by (14) below.
2. For k = 0, . . . , N − 1 construct $\hat{s}(k)$ by aid of linear filtering. The FIR filter (7) has coefficients (10)–(13) with ω there replaced by $\hat{\omega}$ from step 1. The variable L (from (7) and (10)–(13)) is determined from the required number of effective bits in the reconstruction, $b_{IMP}$. A formula for $b_{IMP}$ is given in (19).
3. For k = L, . . . , N − 1 and $x(k) = x_i$ update the table entry $s_i$ for some i ∈ {0, . . . , M − 1} from $\hat{s}(k)$ utilizing (17). The table entries may be initialized by (15).

Initially, the calibration signal is sampled and quantized. The calibration signal s(t) is a continuous time (t[s] is the time instant) sine wave with frequency F [Hz], amplitude A [Volts] where A>0, and initial phase φ [radians], that is $$s(t) = A \sin(2\pi F t + \phi). \quad (1)$$

The frequency F is in the range (0, $F_s/2$) where $F_s$ [Hz] is the sampling frequency. An ideal S/H circuit with sampling rate $F_s$ results in a discrete time signal $$s(k) = A \sin(\omega k + \phi) \quad (2)$$

where $\omega = 2\pi F/F_s$ is the normalized (angular) frequency in (0, π), and k is a running (integer) time index.

Consider a b-bits uniform quantizer. For simplicity, but without Loss of generality, let the maximum swing of the ADC be ±1. Then, the resolution is $$\Delta = \frac{1}{2^{b-1}}. \quad (3)$$

A b-bit quantized signal $x(k)=Q_b[s(k)]$ can be modeled as mathematically represented by (4) and as shown in J. G. Proakis and D. M. Manolakis, *Digital Signal Processing-Principles, Algorithms and Applications*, Prentice Hall International, Third Edition, 1996, Chapter 9.2, pp. 748–762, which is hereby incorporated by reference in its entirety herein, $$x(k) = s(k) + e(k) \quad (4)$$

where $Q_b[\cdot]$ denotes a b-bits quantizer and e(k) is white zero mean quantization noise with variance $$\sigma^2 = \frac{\Delta^2}{12} = \frac{2^{-2b}}{3}. \tag{5}$$

The model from (4)–(5), describing the quantized output of the ADC, is known to be valid for small quantization steps $\Delta$ and when s(k) traverses several quantization levels between two successive samples.

A quality measure for ADCs is the signal-to-quantization noise ratio (SQNR) defined as the ratio of the signal power P to the power of the quantization noise, that is $$SQNR = \frac{P}{\sigma^2} = \frac{3P}{2^{-2b}} \tag{6}$$

where (5) was used in the second equality. For s(k) in (2), it holds that $P=A^2/2$. From (6) it is evident that each additional bit increases SQNR by $20 \log_{10} 2 \approx 6$ dB.

Secondly, in order to reconstruct the calibration signal s(k) from the quantized inputs x(k), an L-th order FIR filter is employed, that is $$\hat{s}(k) = \sum_{l=0}^{L} c_l x(k-l). \tag{7}$$

Filter coefficients ($\{c_l\}$ from l=0 to L) are sought such that $\hat{s}(k)=s(k)$ for a noise-free sinusoidal input (2) (after that the transient died away). In addition, $\{c_l\}$ is sought such that the sensitivity against white (quantization) noise is minimized. The sensitivity against noise, or the so called noise gain (NG), is $$NG = \sum_{l=C}^{L} c_l^2. \tag{8}$$

The optimization problem to be solved is $$\min_{c_0, \ldots, c_L} NG \text{ subject to } s(k) = \sum_{l=0}^{L} c_l s(k-l) \tag{9}$$

where s(k) is the sine-wave in (2). This optimization problem was solved in P. Händel, "Predictive digital filtering of sinusoidal signals", IEEE Transactions on Signal Processing, Vol. 46, No. 2, pp. 364–375, February 1998, which is hereby incorporated by reference in its entirety herein, and the following result holds true $$c_l = \frac{(S_s + S_c)\cos l\omega + (S_s - S_c)\cos l\omega - 2S_{sc}\sin l\omega}{2(S_c S_s - S_{sc}^2)}, l = 0, \ldots, L \tag{10}$$

where $$S_c = \sum_{l=1}^{L+1} \cos^2 l\omega \tag{11}$$

$$S_s = \sum_{l=1}^{L+1} \sin^2 l\omega \tag{12}$$

-continued $$S_{sc} = \sum_{l=1}^{L+1} \sin l\omega \cdot \cos l\omega. \tag{13}$$

The reconstruction filter may be composed of (7) where the coefficients are determined by (10)–(13) with $\omega$ there replaced by an estimate $\hat{\omega}$. Obtaining an estimate $\hat{\omega}$ from the A/D output x(k) is described below.

Thirdly, the frequency of the calibration signal s(t) is estimated. The filter coefficients (10)–(13) do not depend on the initial phase or the amplitude of the calibration signal s(t); they only depend on $\omega$. Several methods may be used to estimate the frequency of a noise corrupted sinusoidal signal. For example, D. C. Rife and R. R. Boorstyn, "Single tone parameter estimation from discrete-time observations", IEEE Transactions on Information Theory, Vol. IT-20, No. 5, pp. 591–598, 1974, which is hereby incorporated by reference in its entirety herein, shows that frequency estimation may be mathematically characterized as $$\hat{\omega} = \arg\max_{\omega} \left| \sum_{k=0}^{N-1} x(k) e^{j\omega k} \right|^2. \tag{14}$$

The maximization of (14) may be performed by aid of the fast Fourier transform followed by an iterative minimization. Using the estimate $\hat{\omega}$ from (14) in place of $\omega$ in (10)–(13) completes the reconstruction of s(k) from x(k).

And fourthly, a reconstruction table may be updated using the following exemplary algorithm. The scheme is based on the expression for the optimal, in the sense that $E[e(k)^2]$ is minimized, reconstruction levels in scalar quantization, as derived by S. P. Lloyd, "Least squares quantization in PCM", IEEE Transactions on Information Theory, Vol. IT-28, pp. 127–135, March 1982, which is hereby incorporated by reference in its entirety herein.

The quantized output, x(k), from the ADC has $M=2^b$ possible different values at time instant k. Let these be $$\{x_0, \ldots, x_{M-1}\} \tag{15}$$

where $x_i$ corresponds to the i-th level of a uniform quantizer. For $k \in \{L, L+1, \ldots, N-1\}$, let $A_i$ (m) be the number of times x(k) has been equal to $x_i$, for $L \leq k < m$, and let $A_i$ (L−1)=0. Now the reconstruction table $$\{s_0, \ldots, s_{M-1}\} \tag{16}$$

can be constructed from $\hat{s}(k)$ as follows: Let $s_i$ be assigned the initial values $s_i=x_i$, i=0, …, M−1. Then, assuming that $x(k)=x_i$ at time instant $k \geq L$, update s according to $$s_i \to \frac{A_i(k)s_i + \hat{s}(k)}{A_i(k)+1}. \tag{17}$$

After the data has been processed, and the table has been updated, the operation of the quantizer becomes: The input signal produces a sample s(k) which is quantized to $x(k)=x_i$, then the quantized value $x_i$ is remapped, using the updated table, to the output $s_i$.

The formula in (17) calculates an average of estimates for every encountered level in the input signal x(k). An averaging process may be considered as similar to a low pass filter. Thus, for an implementation in which the number of calibration samples is limited (e.g., due to limited calibration time or arithmetic resolution in average calculation, for example), the averaging may be replaced with a low pass filter. Consequently, for a limited number of calibration samples per level, the formula (17) may be approximated with $$s_i \to Cs_i + (1-C)\hat{s}(k), \quad C = \frac{N-2}{N}. \quad (18)$$

Because the level of x(k) (which defines the variable "i") acts as the address for the correction table 350 (of FIG. 4C), the calibration functionality as defined by (18) may be implemented with the "(1–C)" multiplier 485, the summer 490, and the "C" multiplier 495.

Referring again to an alternative embodiment of the present invention as illustrated in FIG. 4C, the correction table 350 has a two phase functionality for each sample, one read phase and one write phase. The input signal x(k) with level i acts like an address to the correction table 350 in both phases. In phase one, y(k) gets the value $s_i$ from the correction table 350 and holds it until the end of phase two. This value $s_i$ is multiplied by "C" and summed with the estimate $\hat{s}(k)$ multiplied by "(1–C)". In phase two, the output of the summation is written to the correction table 350. During functional data conversion, the correction table 350 is still mapping x(k) to a value $s_i$ on the output y(k), but no write operation to the correction table 350 is being performed. If the correction table 350 is not initialized, then there is likely to be more of a transient response from the filtering function, thus demanding more samples than if the correction table 350 is initialized. That is, as long as the input of the filter 455 is not connected to y(k) (i.e., not engaged in the feedback case that may be activated by switch 330B of FIG. 3A), the correction table 350 may be initialized by a longer calibration phase. The frequency estimation and coefficient calculation may also be accomplished during the initialization step alone, especially if the frequency of the reference input signal s(t) to the ADC 310 does not drift outside the passband of the filter 455.

Figure 5:
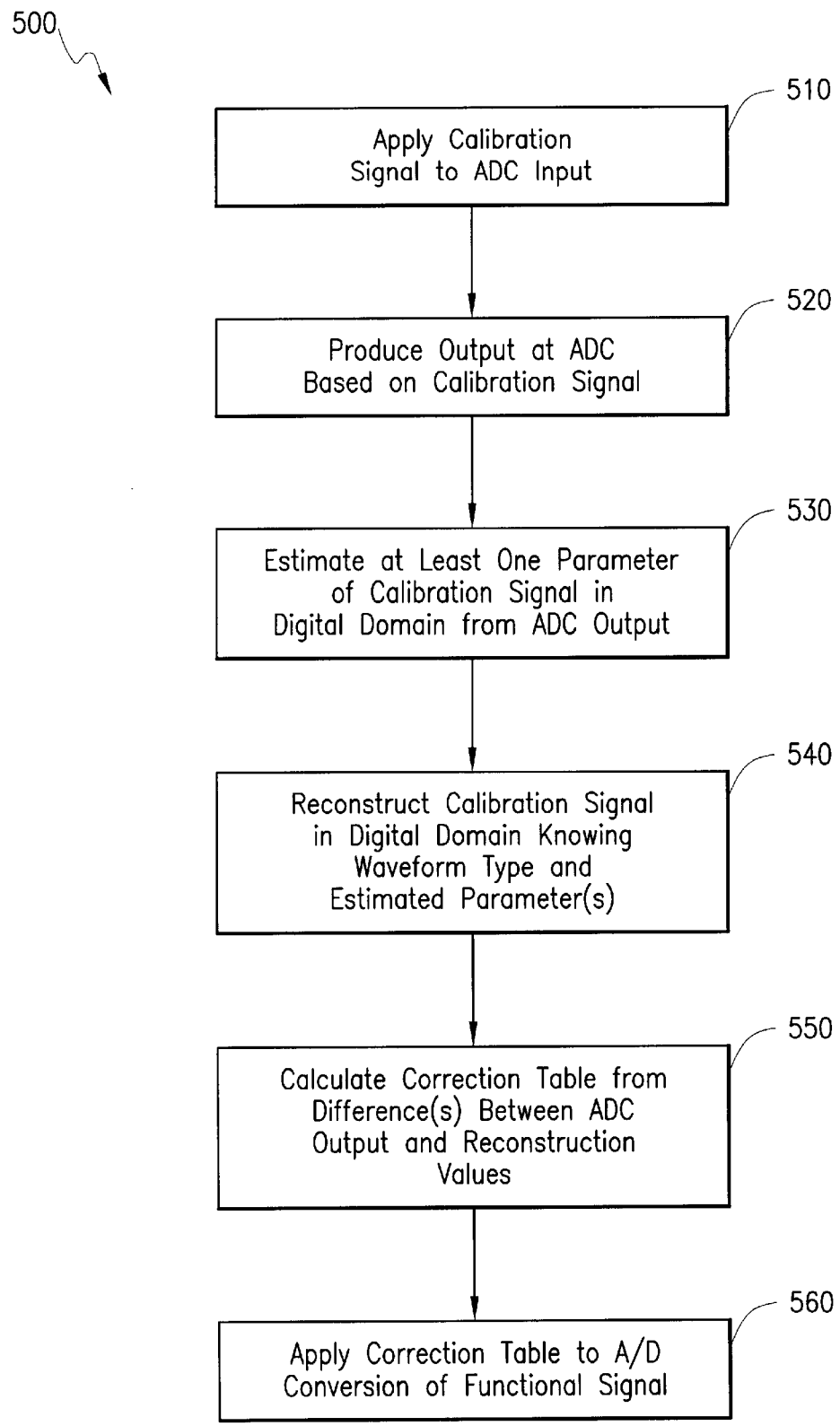
FIG. 5 illustrates an exemplary method in flowchart form for calibrating an ADC in accordance with an embodiment of the present invention.

Referring now to FIG. 5, an exemplary method in flowchart form for calibrating an ADC in accordance with an embodiment of the present invention is illustrated. Flowchart 500 begins with the application of an analog calibration signal to an input of an ADC (step 510). The ADC produces a digital output based on the analog calibration signal input (step 520). Operating in the digital domain, at least one parameter relating to the calibration signal is estimated based on the digital output of the ADC (step 530). The calibration signal is reconstructed in the digital domain based on the type of waveform of the analog calibration signal and the one or more estimated parameters (step 540). A reconstruction data structure may be created and stored. The digital outputs of the ADC are compared to the values in the reconstruction data structure to determine a correction data structure (step 550). The correction data structure (e.g., a table in a memory) may then be applied to A/D conversion of functional signals (step 560).

The ADC is therefore calibrated by applying the entries in the correction data structure to the digital ADC outputs of a functional signal. Advantageously, the correction data structure may be updated continuously to account for, e.g., temperature drift. The method described in the flowchart 500 may be considered a first coarse tuning phase that may be alternatively followed by a finer tuning of the correction table in a second phase. During the second phase, the data passed through the correction table is input to the calibrator. The second phase may also stand alone for satisfactory calibration as long as the correction table is initialized.

Figure 6:
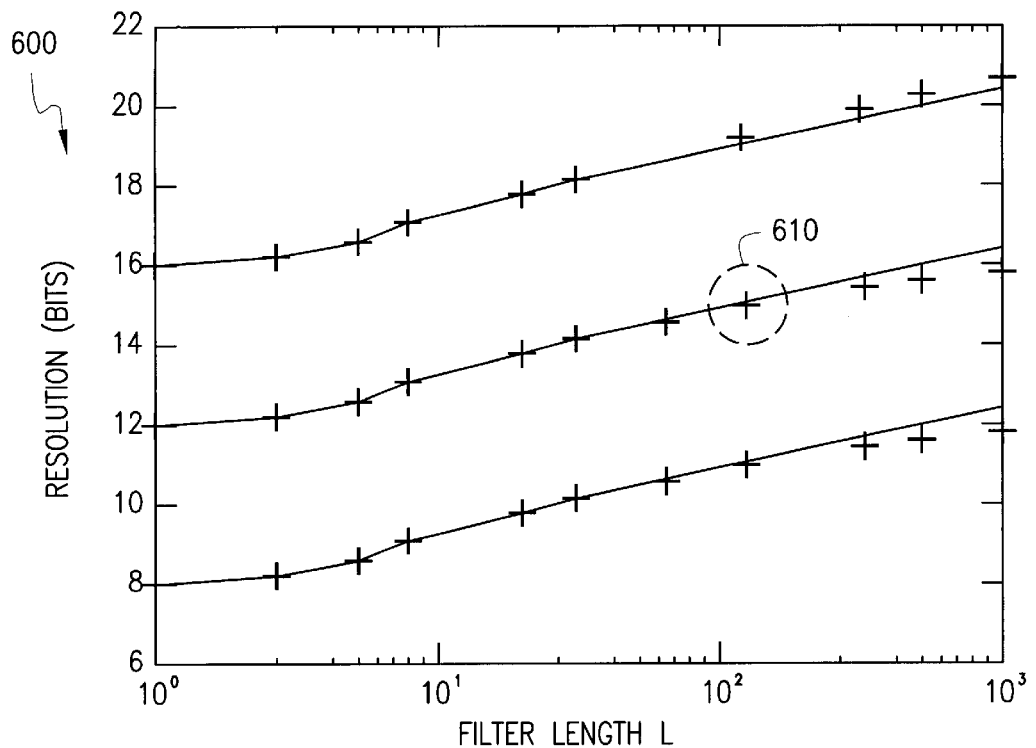
FIG. 6 illustrates an exemplary reference signal reconstruction analysis in graphical form.

Referring now to FIG. 6, an exemplary reference signal reconstruction analysis in graphical form is illustrated. By way of example, reconstruction accuracy of the sampled calibration signal s(k) from quantized data $x(k)=Q_b[s(k)]$, where b=8, 12, and 16, is shown at graph 600. The theoretical (solid lines) and empirical ("+") improvement $b_{IMP}$ is shown as a function of the filter length L.

The effective, or improved, number of bits using the prior knowledge that s(k) is sinusoidal is given by $$b_{IMP} = b - \frac{10 \log_{10} NG}{6} \approx b - 0.50 + 1.67 \log_{10} L \quad (19)$$

where the second equality is based on the approximation that for long filters (i.e., L>>1) the noise gain is NG≈2/L, as can be determined in P. Händel, "Predictive digital filtering of sinusoidal signals", IEEE Transactions on Signal Processing, Vol. 46, No. 2, pp. 364–375, 1998.

The performance of the reconstruction scheme is illustrated at graph 600 with "FILTER LENGTH L" along the abscissa axis and "RESOLUTION (BITS)" along the ordinate axis. The absolute improvement $b_{IMP}$ in recovering a sinusoidal input with frequency ω=0.5 is displayed for b=8, 12, and 16 for different lengths of the filter L. As noted above, in graph 600 solid lines represent theoretical values calculated from (19) and the crosses represent values calculated from simulations. The empirical values are calculated for an ideal uniform quantizer. The frequency is estimated according to (14) and the empirical improvement is measured utilizing sequences of length 10,000 samples. From the graph 600, it may be seen at 610 that for L=100, a quantized b=12 bits sine wave may be reconstructed with $b_{IMP}$=14.8 bits resolution.

Figure 7:
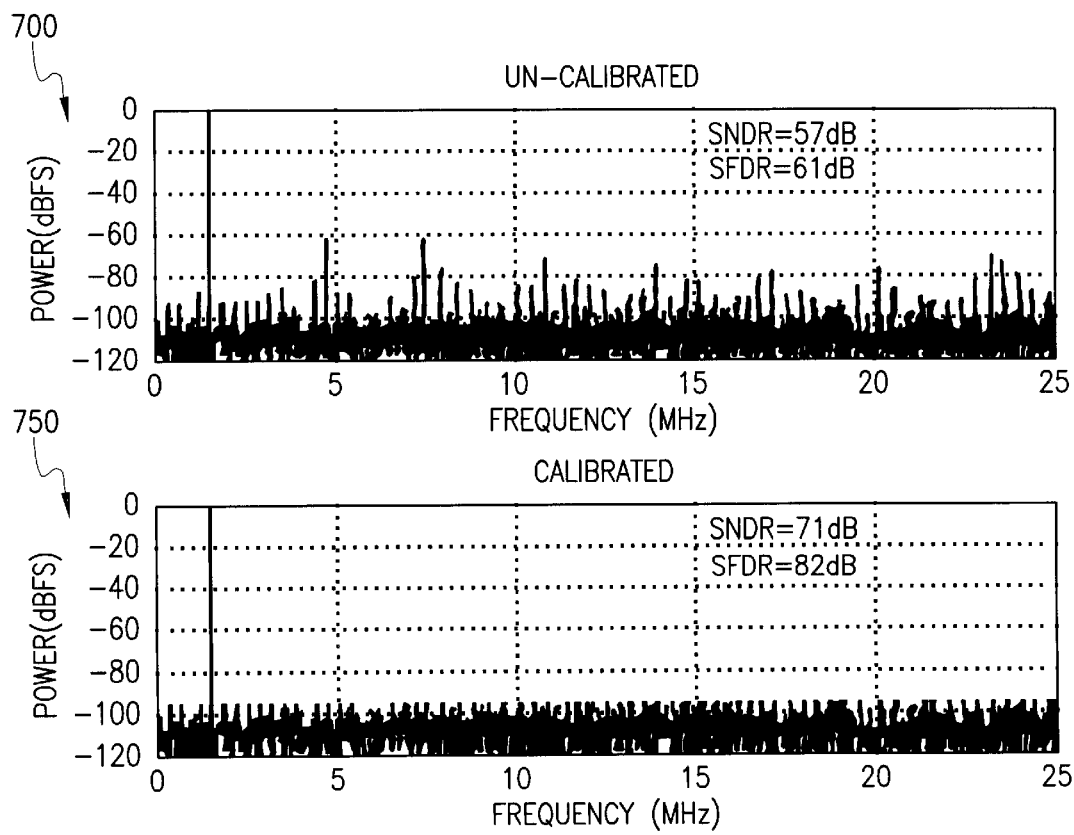
FIG. 7 illustrates exemplary un-calibrated and calibrated performance characteristics in graphical form.

Referring now to FIG. 7, exemplary un-calibrated and calibrated performance characteristics in graphical form are illustrated. Simulation results are provided at un-calibrated graph 700 and calibrated graph 750. In each graph, "FREQUENCY (MHz)" is along the abscissa axis, and "POWER (dBFS)" is along the ordinate axis. The performance of one embodiment of the present invention was evaluated on data from a simulation model describing a 12-bit ADC. The parameters of the calibration signal that was used are: F=11.21826 [MHz], A=0.89 [V] (i.e., a signal level of –1 dBFS), and $F_s$=50 [MHz]. The length of the sequence is N=82000 (i.e., 1.64 ms).

The output x(k) from the simulation model is characterized by a spurious free dynamic range (SFDR) and a signal to noise and distortion ratio (SNDR). Measured figures from the un-calibrated ADC model are:

$$\text{SFDR}=61.3 \text{ dBc} \quad \text{SNDR}=56.8 \text{ dB}. \quad (20)$$

In Table 2, the SFDR and SNDR are shown after calibration as a function of the length L of the reconstruction filter. For the calibrated ADC, performance is measured for input frequency F=1.55 MHz and F=11.2 MHz, respectively. From Table 2, improvements up to 30 dB in SFDR and 15 dB in SNDR may be seen.

TABLE 2

SFDR and SNDR at 1.55/11.2 MHz input
frequency for a calibrated ADC.
The original figures are:

| | SFDR = 61.3 dBc | SNDR = 56.8 dB. |
|---|---|---|
| L | SFDR (dBc) | SNDR (dB) |
| 10 | 80/80 | 69/69 |
| 20 | 81/81 | 70/70 |
| 40 | 86/85 | 71/71 |
| 80 | 91/90 | 71/72 |
| 160 | 92/95 | 71/72 |
| 320 | 92/96 | 71/72 |

Continuing now with FIG. 7, performance characteristics for F=1.55 MHz input at −1 dBFS are shown. Specifically, performance characteristics for an un-calibrated (graph 700) and a calibrated (graph 750) 12-bit ADC for single tone at 1.55 MHz are shown. Power spikes are virtually eliminated in the calibrated graph 750. Also, the SNDR is 14 dB higher and the SFDR is 31 dB higher in the calibrated 12-bit ADC.

Thus, a calibration scheme for ADCs is shown and described. Exemplary advantages are illustrated and performance may be evaluated by utilizing an ADC simulation model. Specifically, for a 12-bit ADC, approximate improvements in SFDR of 30 dB and in SNDR of 15 dB have been illustrated.

In accordance with another embodiment of the present invention, an input (e.g., reference or calibration) signal to an ADC exceeds the dynamic range of the ADC and therefore results in a clipped output digital signal. The digital signal, including the clipped portion(s), is advantageously reconstructed in the digital domain so that the ADC may be calibrated correctly through all quantization levels except for the uppermost and lowermost level.

Figure 8:
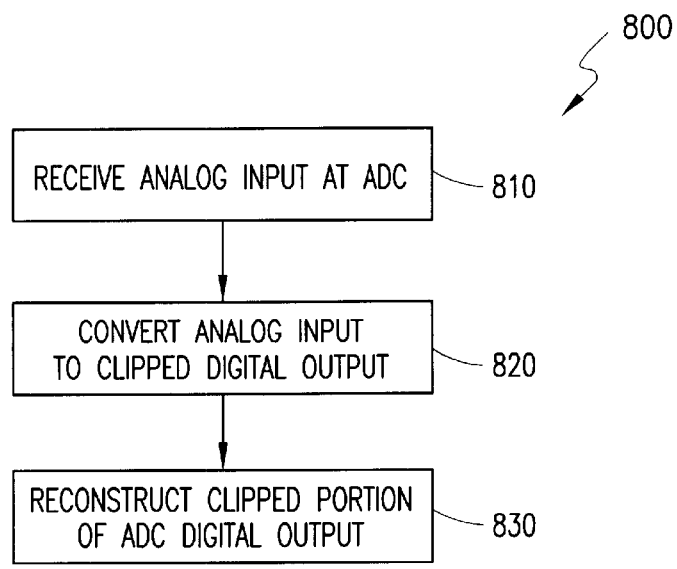
FIG. 8 illustrates an exemplary method in flowchart form for calibrating an ADC in accordance with another embodiment of the present invention.

Referring now to FIG. 8, an exemplary method in flowchart form for calibrating an ADC in accordance with another embodiment of the present invention is illustrated generally at 800. In order to calibrate an ADC, an (e.g., reference or calibration) analog input is received at the ADC (step 810) that exceeds the full scale swing of the ADC. The analog input signal is converted into a clipped digital output (step 820). The ADC digital output, including the clipped portion(s), is reconstructed (step 830) (e.g., using information regarding the input signal waveform (e.g., waveform type) and known or estimated parameter(s) thereof) so that the ADC may subsequently be more fully and correctly calibrated. Other aspects and/or alternatives of the improved calibration of the present invention are described further hereinbelow.

A nonlinear reconstruction scheme for clipped (e.g., sinusoidal) signals is described. This scheme may optionally be used to improve the above-described scheme for calibration of ADCs that involves estimating aspects of one or more relevant parameters. This scheme is especially advantageous when the swing of the calibration/reference signal exceeds the full swing of the ADC. In a preferred embodiment, the reconstruction of the clipped signal is effectuated by using predictive filters.

A mathematical derivation and explanation of one embodiment is now described. Let x(k) be the discrete-time clipped sine-wave $$x(k) = \begin{cases} s(k) & -U_L < s(k) < U_U \\ -U_L & s(k) \leq -U_L \\ U_U & s(k) \geq U_U \end{cases} \quad k = \ldots, -1, 0, 1, \ldots \quad (21)$$

where $U_U$ and $U_L$ are some positive constants, and $$s(k) = A \sin(\omega k + \phi) \quad (22)$$

In equation (22), A>0 is the amplitude (typically, A>($U_U$, $U_L$)), ω is the (angular) frequency, and φ is the initial phase.

Figure 9:
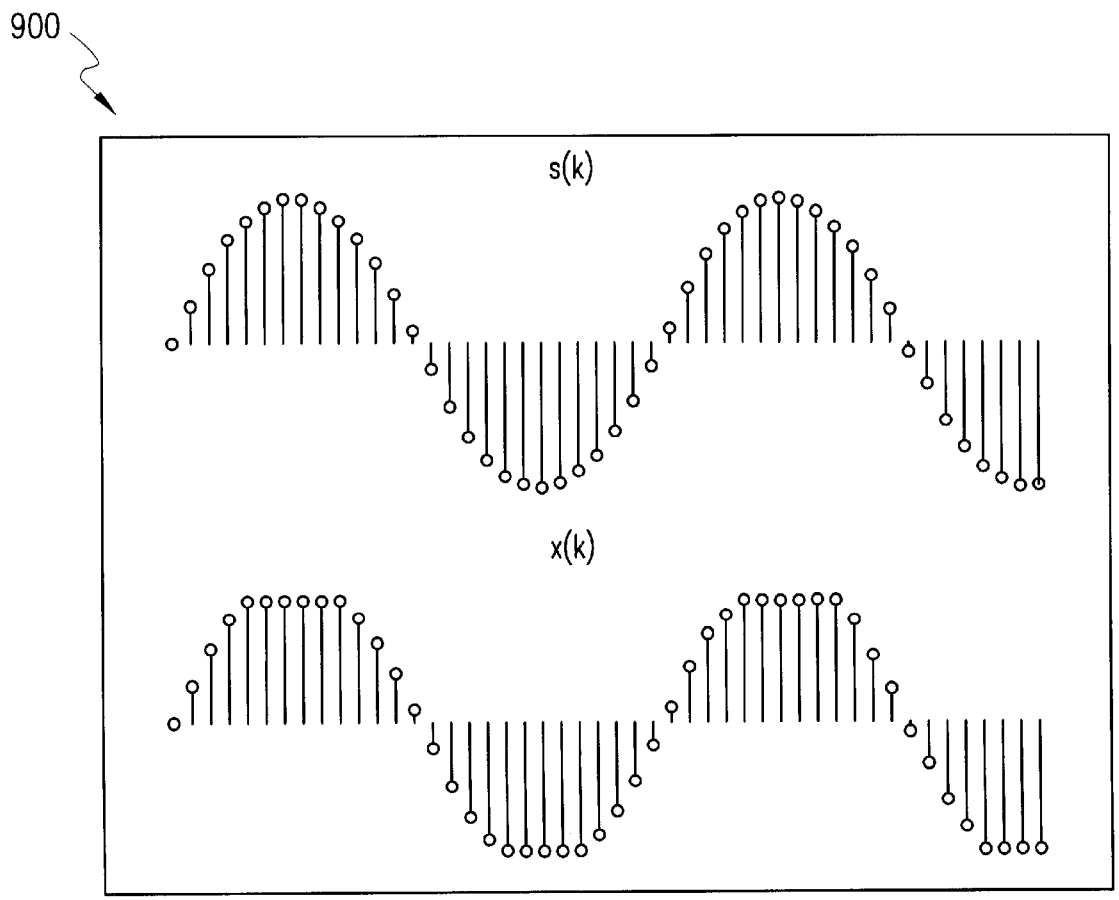
FIG. 9 illustrates a clipped and an unclipped signal that may be manipulated in accordance with the present invention.

Referring now to FIG. 9, a clipped and an unclipped signal that may be manipulated in accordance with the present invention is illustrated generally at 900 by s(k) and x(k). The signals of 900 illustrate the typical behavior of s(k) (the top graph) and x(k) (the bottom graph), where x(k) is the clipped signal. In the exemplary graphs of 900, A=1, $U_U$=0.8, and $U_L$=0.9.

The problem to be solved is the reconstruction of the source signal {s(k)} from the observations {x(k)}. Consider the nonlinear filtering algorithm $$\bar{s}(k) = \begin{cases} x(k) & -U_L < x(k) < U_U \\ \hat{s}(k) & x(k) = -U_L \text{ or } x(k) = U_U \end{cases} \quad (23)$$

where ŝ(k) is an estimate of s(k) based on the observations {x(k)}. Two different exemplary scenarios are considered, e.g., when i) S̄(k) is based on past observations {x(k), x(k−1), . . . } only, and ii) when S̄(k) is based on all observations. Below, the former scenario is considered. The solution for the second scenario is described thereafter.

First (to simplify the initial explanation and to aid understanding), let x(l)=s(l) for l<k and x(l)=$U_U$ for l≧k. Then, ŝ(l) for l=k, k+1, . . . is sought based on the observations up to and including time instant k−1. Such an estimate is denoted by ŝ(k+p|k−1), p=1,2, . . . where p is the prediction horizon with respect to time instant k−1. Assume that we can find ŝ(k+p|k−1) as a linear combination of old observations, i.e.

$$\hat{s}(k+p \mid k-1) = \sum_{l=0}^{L} C_l^p \times (k-1-l) \quad (24)$$

where $\{C_l^p\}$(l=0, . . . , L) are the filter coefficients. The filter length L is a design variable that determines the trade-off between numerical complexity and performance in terms of noise rejection. If suitable filter coefficients $\{C_l^p\}$ can be found, then the problem is solved by the filter $$\bar{s}(l) = \begin{cases} x(l) & l = \ldots, 0, \ldots, k-1 \\ \hat{s}(l \mid k-1) & l = k, k+1, \ldots \end{cases} \quad (25)$$

Figure 11:
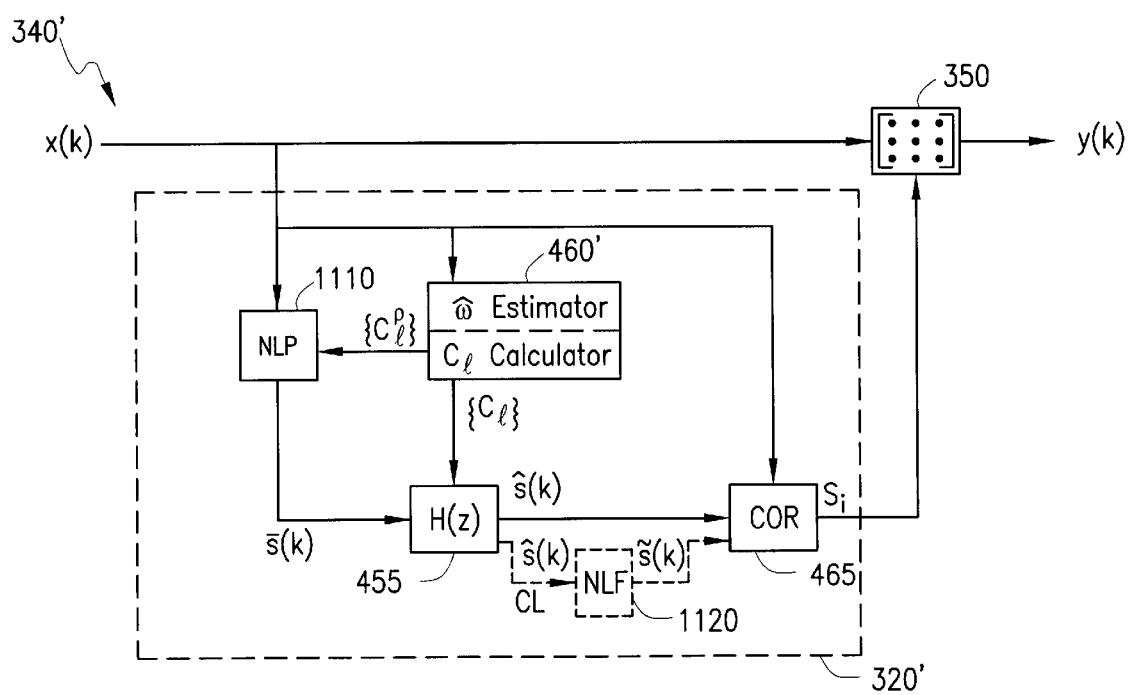
FIG. 11 illustrates exemplary details of another embodiment of calibration logic in accordance with the present invention.

The prediction constraint can be formulated as $$s(k+p) = \sum_{l=0}^{L} c_l^p \times (k-1-l) \quad (26)$$

where s(k) is defined in (22). For L>2, the constraint can be fulfilled by an infinity set of coefficients $\{C_l^p\}$ so a certain flexibility in the choice of filter coefficient is present. In an exemplary implementation (e.g., as illustrated in FIG. 11 below), it is reasonable to add a constraint so that the noise gain NG of the filter is minimized, i.e.

$$\min_{c_0^p,\ldots,c_L^p} NG \text{ subject to } s(k+p) = \sum_{l=0}^{L} c_l^p \times (k-1-l) \quad (27)$$

where the noise gain is defined by $$L = \begin{pmatrix} \cos\omega & \ldots & \cos(L+1)\omega \\ \sin\omega & \ldots & \sin(L+1)\omega \end{pmatrix} \quad p_p = \begin{pmatrix} \cos(1-p)\omega \\ \sin(1-p)\omega \end{pmatrix} \quad (30)$$

The optimization problem of equation (27) is solved in P. H ändel, "Predictive digital filtering of sinusoidal signals", IEEE Transactions on Signal Processing, Vol. 46, No. 2, pp. 364–375, February 1998, which is incorporated by reference in its entirety herein. The solution is (where T denotes transpose and −1 denotes matrix inverse)

$$C_p = L^T (LL^T)^{-1} P_p \quad (29)$$

where the filter coefficients are gathered in the vector $C_p$, i.e., $C_p = (C_O^P \ldots C_L^P)^T$, and $$L = \begin{pmatrix} \cos\omega & \ldots & \cos(L+1)\omega \\ \sin\omega & \ldots & \sin(L+1)\omega \end{pmatrix} \quad (30)$$

$$p_p = \begin{pmatrix} \cos(1-p)\omega \\ \sin(1-p)\omega \end{pmatrix}$$

Other choices of filter coefficients are possible as long as the constraint of equation (26) is fulfilled. Other criteria for designing the filter may alternatively be utilized. However, in the exemplary implementation, the quantization noise is commonly considered to be spectrally flat, and thus a design that minimizes noise gain is typically a favorable option as compared to alternative methods.

An exemplary real-time algorithm for processing the data in a non-linear fashion is provided. The exemplary algorithm is summarized in the pseudo code in Table 3 below.

TABLE 3

```
if x(k) = U_U
    if x(k - 1) ≠ U_U
        p: = 1
    else
        p: = p + 1
    end
    calculate {C_O^P, ..., C_L^P} from (29)

s̄(k) = ŝ(k)
else if x(k) = −U_L
    if x(k - 1) ≠ −U_L
        p:= 1
    else
        p:= p + 1
    end
    calculate {C_O^P, ..., C_L^P} from (29)

prediction: ŝ(k) = ∑_{l=0}^{L} C_l^p s̄(k − p − l)

s̄(k) = ŝ(k)
else
    p:= 0
    s̄(k) = x(k)
end
```

The exemplary algorithm summarized in the pseudo code in Table 3 above operates (i) in dependence on whether the digital output to be reconstructed is above or below the maximum swing of the ADC and (ii) in dependence on the number of samples for which the digital output that is to be reconstructed has been above or below the maximum swing of the ADC.

Figure 10:
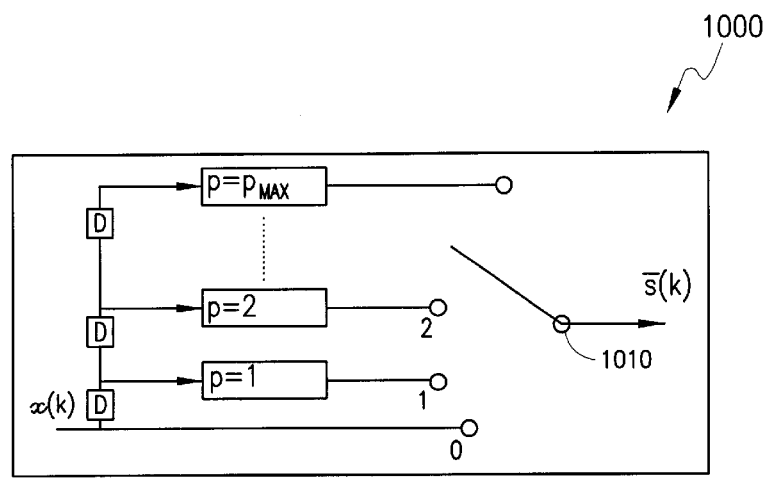
FIG. 10 illustrates a filtering mechanism in accordance with the present invention.

Referring now to FIG. 10, a filtering mechanism in accordance with the present invention is illustrated generally at 1000. The filtering mechanism 1000 may be used, for example, as an embodiment of part of the algorithm presented in the pseudo code in Table 3 (above). Other alternative implementations are also possible. The filtering mechanism 1000 illustrates a block diagram utilizing "$p_{MAX}$" filters and a decision controlled switch 1010. The filters (labeled "p=1", etc.) may be designed according to equation (26) with coefficients determined by equation (29), and the "D" blocks may represent unit delays. The decision control switch 1010 may be controlled by the variable "p" of the pseudo code of Table 3. In one conceptual approach, the filters "p=1", "p=2", ... "p=$p_{MAX}$" may be considered FIR filters, i.e., arrays of input signal values that are delayed in time and that are weighted with different coefficients to form an output value. Under this conceptual approach, when the x(k) signal reaches a limit, the rotational multiplexer (mux) switch 1010 selects the first filter "p=1", which contains values x(k−1) to x(k−N), depending on the filter length.

Under the assumptions given above, x(k−1) is the last reliable value of the input signal; hence, the delay element(s) denoted by "D". After another clock pulse, the rotational mux switch 1010 connects to the "p=2" filter, which contains values x(k−1) to x(k−N) as a result of the two "D" elements in series. Consequently, for a FIR filter, the stored values x(k−1) to x(k−N) can be held and only the weighting coefficients for forming the output signal need be changed. The coefficients for the blocks "p=1" ... "$p_{MAX}$" are different from each other and correspond to a phase shift of the stored replica produced at each filter output for the same array contents.

The filtering mechanism 1000 thus illustrates an approach that enables the calculating and the pre-storing of the coefficients in several filters. Therefore, when the calibration is running at full speed, the filters may be configured in advance so that the only aspect to control in the NLP is the rotational switch 1010. The estimator/calculator block 460' (of FIG. 11), however, calculates a set of coefficients for each value of p in this approach. (An NLP implementation of the present invention is described further hereinbelow with reference to FIG. 11.) This embodiment uses the same input signal data x(k−1) to x(k−N) for each new output. In an alternative implementation, an interpolating filter marked "p−1" (as in FIG. 10) and the signal estimating filter H(z) 455 (of FIGS. 4B and 11) may be combined to make one filter. The resulting filter functionality may be split into two filters (e.g., based on phase).

In a first approach described above with reference to the algorithm of Table 3, the prediction ŝ(k) is formed from a linear combination of {S̄(k-p), ..., S̄(k-p-L)}. A second approach (e.g., an alternative approach) is to form the prediction from a linear combination of {x(k-p), ..., x(k-p-L)}, excluding the samples that are equal to $U_U$ and $-U_L$. The performance of the second approach may be better than that of the first approach, but the cost is a greater numerical complexity. In other words, for the first approach the filter coefficients $C_p$ can be pre-computed and stored in a table for different values of p. The second approach, on the other hand, involves an optimization problem similar to the one of equation (27) being solved each time a prediction is sought. A third approach (e.g., another alternative approach) may be employed with, for example, off-line processing. In an off-line processing state, predictions of clipped samples may be based on filtering as described above (e.g., in the forward direction) as well as filtering in reversed time. An averaged prediction based on both the forward prediction and the backward prediction may improve performance in certain situations.

As described hereinabove, as well as in the Parent Application, methods and arrangements for calibration of ADCs may, in certain embodiments, involve the inputting of a pure tone from an analog oscillator and the performing of the actual calibration based on the sampled and quantized signal only, i.e., using the output from the ADC. The calibration may be fully performed in software. However, at least one deficiency of the methods and arrangements of the Parent Application remains; this Continuation-in-Part Application addresses this at least one deficiency. To explain this at least one deficiency by way of example, assume for simplicity that the full swing of the ADC is ±1[V]. Ideally, the swing of the oscillator output (e.g., s(t)=A sin (2πFt)) shall be ±1[V] (0 dBFS) so that all quantization levels of the ADC are excited during the calibration process. If the amplitude A is less than 1 [V], the ADC will not be fully calibrated, which leads to a loss in performance. On the other hand, if A becomes larger than 1 [V], then the swing of s(t) exceeds the full swing of the ADC, which results in an erroneous calibration.

For one exemplary simulation model for a 12-bit nonperfect ADC, the influence of amplitude swing of the calibration signal on the performance is illustrated in Table 4 (below).

TABLE 4

| | UNCALIBRATED | UNCOMPENSATED | | | COMPENSATED | | |
|---|---|---|---|---|---|---|---|
| | | −1 dBFS | 0 dBFS | +1 dBFS | −1 dBFS | 0 dBFS | +1 dBFS |
| SFDR | 62.3 | 67.3 | 75.5 | 58.3 | 67.0 | 75.5 | 75.6 |
| SNDR | 57.1 | 60.6 | 63.4 | 43.6 | 60.5 | 63.4 | 61.5 |

In Table 4, the performance in terms of signal-to-noise-and-distortion ratio (SNDR) and spurious-free-dynamic range (SFDR) are displayed. The calibration in the exemplary simulation is performed (at a sampling frequency of 50 MHz) at F=11.21826 [MHz] and different amplitudes, i.e., A ∈ {0.89, 1.00, 1.12} [V] (−1,0,1 dBFS, respectively). The evaluation is performed at F=1.550297 [MHz] and 0 dBFS. Values for SFDR and SNDR for an uncalibrated and a calibrated ADC both with and without a proposed non-linear compensator are included. The calibration signal is F=11.21826 MHz with amplitudes {−1,0,+1} dBFS, respectively. For the Table 4, the SFDR and SNDR are measured at F=1.550297 MHz and 0 dBFS. It should be noted that the values of Table 4 were produced using an embodiment that includes the NLF 1120, which is described below with reference to FIG. 11.

It can be gleaned from Table 4 that for uncompensated calibration (e.g., using solely the invention also presented in the Parent Application) a significant difference in performance is obtained depending on the amplitude swing of the calibration signal. As is predictable after understanding the principles of the present invention, the best calibration of the three is achieved for 0 dBFS. Notably, the performance of the calibrated ADC is actually worse than the performance of the uncalibrated ADC when the calibration signal s(t) exceeds the full swing of the ADC. Advantageously, by adding the non-linear filtering technique derived in the previous section (e.g., the reconstruction of clipped portion (s) of the ADC digital output) to the calibration scheme that is also presented in the Parent Application, performance is significantly improved. Table 4 indicates that for a calibration signal at 1 dBFS, the compensator fully eliminates the effects seen above.

Referring now to FIG. 11, exemplary details of another embodiment of calibration logic in accordance with the present invention is illustrated generally at 340'. The calibrator 340' includes elements and operational principles that are substantially similar to those of the calibrator 340 (of FIG. 4B). However, certain element (s) and operational principles in accordance with the flowchart 800 (of FIG. 8), the pseudo code of Table 3 (above), the filtering mechanism 1000 (of FIG. 10), etc. may be incorporated into the calibrator 340'. The calibrator 340' includes an NLP 1110 that may have, for example, the functionality presented by the pseudo code in Table 3 (above), except for the calculation of the $\{C_i^p\}$ coefficients from equation (29) as the $\{C_i^p\}$ coefficients may be received as input.

The NLP 1110 receives as input the digital output signal x(k) from the ADC 310 (of FIG. 4A) and the coefficients $\{C_i^p\}$ from the estimator and coefficient calculator 460'. Alternatively, the $\{C_i^p\}$ coefficients may be calculated by the NLP 1110 or another processing element. The estimator and coefficient calculator 460' may calculate the $\{C_i^p\}$ coefficients for all values of p in a range from 0 to K, where K may be a predetermined maximum number of interpolated, predicted samples. While the path that carries the $\{C_i^p\}$ coefficients between the estimator and coefficient calculator 460' contains a significant amount of information, the path (e.g., software matrix/vector variable, bus, oarallel lead lines, etc.) need only be active during a phase corresponding for example to, for example, step 530 of FIGS. 5 and 12.

The output $\overline{S}(k)$ of the NLP 1110 provides the input to the (e.g., FIR) filter 455. The FIR filter 455 may thereafter perform as explained hereinabove with reference to FIG. 4B by producing ŝ(k) and providing ŝ(k) to the correction calculator 465. An embodiment of the clipping compensator in accordance with the present invention has therefore been described with reference to the NLP 1110, etc. of FIG. 11. In an alternative embodiment, the FIR filter 455 may provide ŝ(k) to an optional NLF 1120. As explained further hereinbelow, the NLF 1120 makes the correction table 350 values for the endpoint levels of the ADC code remain at their respective initialized values. Without the NLF 1120, these two levels will possibly be calibrated to a faulty level in the correction table 350.

In this alternative embodiment, the NLF 1120 (e.g., a signal truncator or limiter) is added between the (e.g., FIR) filter 455 and the correction calculator 465 in the calibrator 340'. The NLF 1120 receives as input the ŝ(k) output of the FIR filter 455, operates thereon according to the equation (31) below, and produces s̃(k) as output. The s̃(k) output is thereafter provided as the input to the correction calculator 465 for subsequent processing. The NLF 1120 may operate according to the following equation:

$$\tilde{s}(k) = \begin{cases} \hat{s}(k) & -U_L < \hat{s}(k) < U_U \\ -U_L & \hat{s}(k) \le -U_L \\ U_U & \hat{s}(k) \ge U_U \end{cases} \quad (31)$$

where $U_U$ denotes the maximum ADC 310 output, and $-U_L$ denotes the minimum ADC 310 output. The NLF 1120 ensures that the result from the correction calculator 465 is zero when the ADC 310 is at the maximum and minimum levels of the ADC 310. Consequently, the ADC endpoints are not calibrated. The NLF 1120 may optionally not be included with the result that the endpoints may be completely faulty; however, this is a minor deficiency inasmuch as only two levels are affected.

It should be noted that the NLP 1110 functionality, as well as the calculation of the $\{C_i^p\}$ coefficients, may alternatively be utilized in an ADC calibration scheme that does not involve parameter estimation of the reference signal. In such an alternative embodiment, for example, the NLP 1110 and the FIR filter 455 may be combined, as suggested above with reference to FIG. 10. It should be understood that relevant parameter(s) (e.g., the frequency) of the reference signal, if not estimated, need(s) to be otherwise known to calculate filter coefficients. This alternative embodiment is further explained hereinbelow with reference to FIG. 12.

Figure 12:
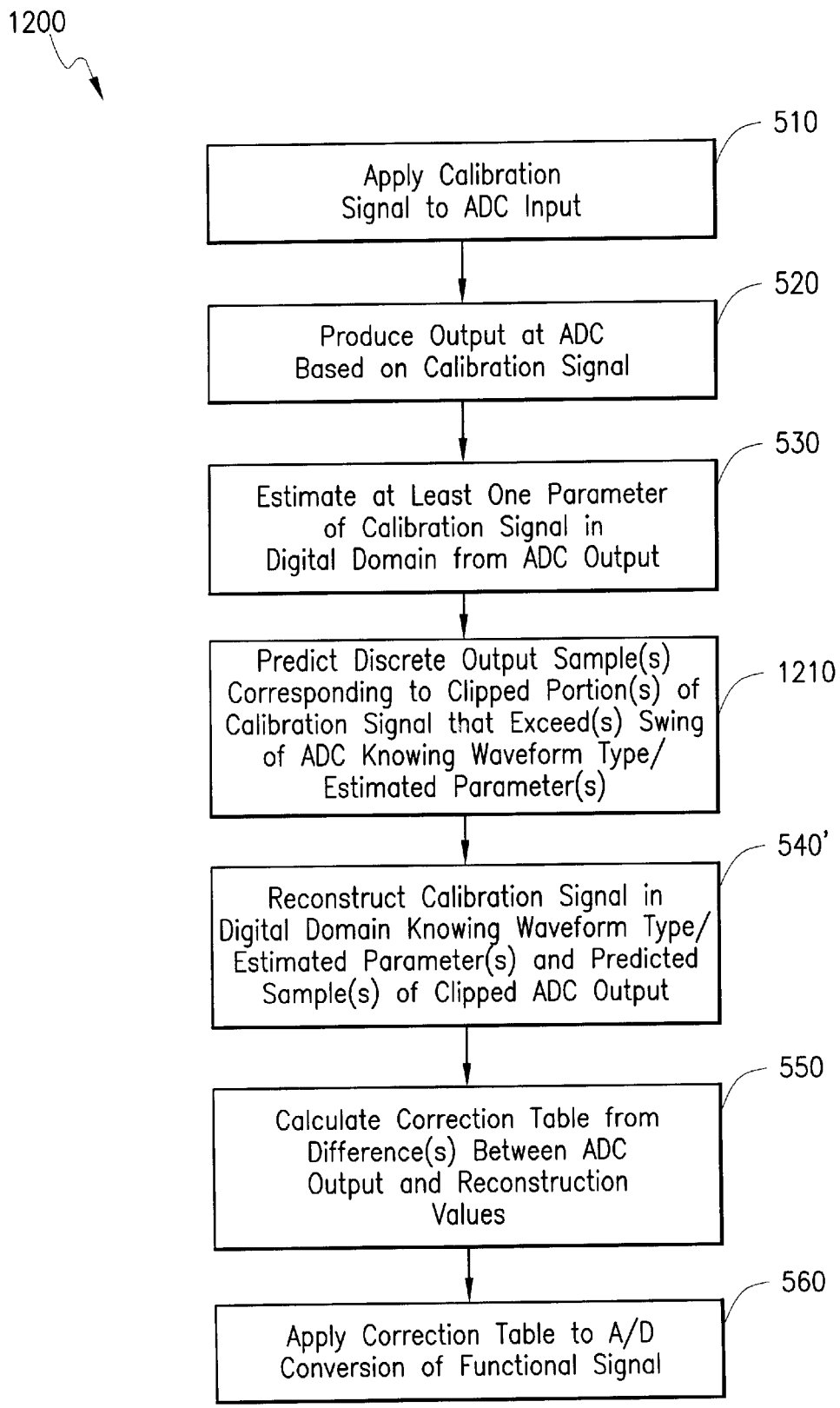
FIG. 12 illustrates another exemplary method in flowchart form for calibrating an ADC in accordance with another embodiment of the present invention.

Referring now to FIG. 12, another exemplary method in flowchart form for calibrating an ADC in accordance with another embodiment of the present invention is illustrated generally at 1200. The flowchart 1200 includes steps and principles that are substantially similar to those of the flowchart 500 (of FIG. 5). However, the flowchart 1200 also adds a step directed to predicting clipped portion(s) of a calibration signal and modifies a step directed to reconstructing the calibration signal. After a digital output is produced by the ADC from an analog calibration signal input (at step 520), at least one parameter (e.g., the frequency) of the analog calibration signal input is estimated from both the unclipped and clipped output samples (step 530). The unclipped output samples together with both the estimated at least ore parameter (e.g. the frequency) and the waveform type are used to predict discrete output sample(s) that correspond to clipped portion(s) of the sampled output data (step 1210). These clipped portion(s) correspond to portion(s) of the analog calibration signal that exceed the swing of the ADC. The calibration signal may be reconstructed in the digital domain knowing the waveform type and estimated parameter(s) of the calibration signal as well as the predicted samples of the clipped ADC output and the unclipped ADC output samples (step 540').

It should be noted that the clipped sample prediction functionality (e.g., step 1210), as well as the calibration signal reconstruction, may alternatively be utilized in an ADC calibration scheme that does not involve parameter estimation of the reference signal (e.g., step 530). In other words, the flowchart 1200 may alternatively not involve step 530. Instead, discrete output clipped samples may be predicted knowing the waveform type and relevant parameter(s) (e.g., the frequency) of the calibration signal as well as the unclipped output samples. Thus, step 1210 may be modified by using a known, not estimated, frequency for example. Also, the calibration signal may be reconstructed in the digital domain knowing the waveform type and relevant parameter(s) (e.g., the frequency) as well as the unclipped samples and predicted clipped sample(s). Thus step 540' may also be modified by using a known, not estimated, frequency for example.

In another alternative embodiment, the amplitude of the calibration signal may by maintained well inside the ADC's dynamic range during a parameter (e.g., frequency) estimation phase. This may enable the parameter estimation algorithm to be less robust (e.g., simpler, shorter, and/or faster, etc.). After the relevant parameter(s) have been estimated, the amplitude of the calibration signal may be increased to beyond the dynamic range of the ADC in order to permit full-scale calibration in accordance with certain principles of the invention.

Although preferred embodiment(s) of the methods and arrangements of the present invention have been illustrated in the accompanying Drawings and described in the foregoing Detailed Description, it will be understood that the present invention is not limited to the embodiment(s) disclosed, but is capable of numerous rearrangements, modifications, and substitutions without departing from the spirit and scope of the present invention as set forth and defined by the following claims.

What is claimed is:

1. A method for calibrating analog-to-digital conversion, comprising the steps of:

converting an analog input to a clipped digital output, said clipped digital output including a plurality of clipped values and a plurality of non-clipped values;

estimating at least one parameter related to said analog input based, at least in part, on said plurality of clipped values and said plurality of non-clipped values;

predicting a plurality of predicted values corresponding to said plurality of clipped values based, at least partly, on said plurality of non-clipped values and said at least one parameter;

digitally reconstructing at least a portion of said analog input based, at least partly, on said plurality of predicted values and said at least one parameter to produce a plurality of reconstructed values; and comparing said plurality of reconstructed values to said plurality of non-clipped values and said plurality of predicted values.

2. The method according to claim 1, wherein said plurality of non-clipped values occur in time only before said plurality of clipped values.

3. The method according to claim 1, wherein said plurality of non-clipped values occur in time both before and after said plurality of clipped values.

4. The method according to claim 1, further comprising the step of:

determining an entry for a correction table based, at least partially, on said step of comparing.

5. The method according to claim 4, further comprising the step of:

producing a calibrated digital output responsive, at least partly, to said entry.

6. The method according to claim 4, further comprising the step of:

accessing said correction table using addresses that are responsive to a digital output from an analog-to-digital conversion.

7. The method according to claim 1, wherein said step of digitally reconstructing at least a portion of said analog input is effectuated using a filter.

8. The method according to claim 7, wherein said filter comprises a finite impulse response (FIR) filter, and coefficients of said FIR filter are set to minimize noise gain.

9. The method according to claim 1, wherein said analog input is an input signal of the type selected from the group comprising a sine wave, a sum of several sine waves, a saw-tooth wave, and a triangle wave.

10. A method for calibrating an analog-to-digital converter using an analog reference signal with at least one parameter and an amplitude exceeding the full scale swing of the analog-to-digital converter, comprising the steps of:

receiving said analog reference signal;

sampling said analog reference signal to produce a sampled reference signal;

converting said sampled reference signal to a digital signal, said digital signal including a plurality of clipped portions and a plurality of non-clipped portions;

ascertaining said at least one parameter of said analog reference signal from a known input or from said digital signal via estimation;

predicting values corresponding to at least one clipped portion of said plurality of clipped portions via at least one digital prediction filter using at least one non-clipped portion of said plurality of non-clipped portions, said at least one digital prediction filter having coefficients that depend on a known waveform type and said at least one parameter of said analog reference signal;

calculating a plurality of coefficients for at least one reconstruction filter;

reconstructing said sampled reference signal using said at least one parameter, said at least one non-clipped portion of said plurality of non-clipped portions, said predicted values corresponding to said at least one clipped portion of said plurality of clipped portions, and said plurality of coefficients; and determining a correction table using the reconstructed sampled reference signal and said digital signal.

11. A method for calibrating analog-to-digital conversion, comprising the steps of:

receiving an analog input at an analog-to-digital converter;

converting said analog input to a digital output that is at least partially clipped;

estimating from said digital output at least one parameter related to said analog input;

predicting a non-clipped version of at least one clipped portion of said digital output based on at least one non-clipped portion and said at least one parameter from said digital output; and calibrating the analog-to-digital conversion based on said non-clipped version of said at least one clipped portion and said at least one non-clipped portion.

12. A calibrator for an analog-to-digital converter, said analog-to-digital converter converting an analog input to a digital output, comprising:

a non-linear processor adapted to predict values corresponding to at least one clipped portion of said digital output;

a filter adapted to utilize at least one parameter related to said analog input and an output of said non-linear processor to reconstruct said analog input digitally; and a table generator adapted to calculate correction table entries based, at least partly, on the digitally reconstructed analog input.

13. The calibrator of claim 12, further comprising:

an estimator adapted to estimate said at least one parameter related to said analog input based, at least in part, on said digital output; and wherein said filter utilizes said at least one parameter related to said analog input as estimated by said estimator.

14. The calibrator of claim 13, wherein said non-linear processor predicts said values corresponding to said at least one clipped portion via interpolation using at least one digital filter, said at least one digital filter having a plurality of coefficients that depend on a known waveform type of said analog input and said at least one parameter as estimated by said estimator.

15. The calibrator of claim 12, wherein said filter comprises a finite impulse response (FIR) filter, and coefficients of said FIR filter are set to minimize noise gain.

16. The calibrator of claim 12, wherein said table generator is adapted to calculate said correction table entries based, at least partly, on a comparison between the digitally reconstructed analog input and said digital output.

17. The calibrator of claim 12, wherein said table generator is adapted to calculate correction table entries within a dynamic range of said analog-to-digital converter.

18. The calibrator of claim 12, wherein said non-linear processor predicts said values corresponding to said at least one clipped portion of said digital output when said digital output corresponds to said analog input at instants when said analog input is not a functional signal.

19. The calibrator of claim 12, wherein said non-linear processor predicts said values corresponding to said at least one clipped portion based on at least one non-clipped portion of said digital output.

20. A method for calibrating an analog-to-digital converter using an analog reference signal with at least one unknown parameter and an amplitude exceeding the full scale swing of the analog-to-digital converter, comprising the steps of:

receiving said analog reference signal;

sampling said analog reference signal to produce a sampled reference signal;

converting said sampled reference signal to a digital signal, said digital signal including a plurality of clipped portions and a plurality of non-clipped portions;

estimating said at least one unknown parameter of said analog reference signal from said digital signal;

predicting values corresponding to at least one clipped portion of said plurality of clipped portions using at least one non-clipped portion of said plurality of non-clipped portions;

calculating a plurality of coefficients for a filter;

reconstructing said sampled reference signal using said at least one unknown parameter, said at least one non-clipped portion of said plurality of non-clipped portions, said predicted values corresponding to said at least one clipped portion of said plurality of clipped portions, and said plurality of coefficients; and determining a correction table using the reconstructed sampled reference signal and said digital signal.

21. An arrangement for calibrating analog-to-digital conversion, comprising:

means for converting an analog input to a clipped digital output, said clipped digital output including a plurality of clipped values and a plurality of non-clipped values;

means for estimating at least one parameter related to said analog input based, at least in part, on said plurality of clipped values and said plurality of non-clipped values;

means for predicting a plurality of predicted values corresponding to said plurality of clipped values based, at least partly, on said plurality of non-clipped values and said at least one parameter;

means for digitally reconstructing at least a portion of said analog input based, at least partly, on said plurality of predicted values and said at least one parameter to produce a plurality of reconstructed values; and means for comparing said plurality of reconstructed values to said plurality of non-clipped values and said plurality of predicted values.

22. A method for calibrating analog-to-digital conversion, comprising the steps of:

receiving an analog signal having a first amplitude;

converting said analog signal to a digital signal having a second amplitude, said second amplitude corresponding approximately to a full-scale swing of the analog-to-digital conversion, said first amplitude exceeding said second amplitude;

estimating at least one parameter related to said analog signal;

predicting at least one clipped portion of said digital signal, said at least one clipped portion having at least one amplitude level approximately between said first and second amplitudes;

reconstructing said analog signal in the digital domain to create a reconstructed digital signal using at least a portion of said digital signal, said at least one predicted clipped portion, and said at least one parameter related to said analog signal; and determining at least one corrective value based on a comparison between said reconstructed digital signal and said digital signal.

23. The method according to claim 22, wherein said step of reconstructing said analog signal in a digital domain to create a reconstructed digital signal further involves using a known waveform type of said analog signal; and further comprising the steps of:

storing said at least one corrective value in a correction table; and accessing said correction table to produce a calibrated output based on a new digital signal that is converted from an analog functional signal.

24. A method for calibrating analog-to-digital conversion, comprising the steps of:

converting an analog input to an uncalibrated digital output, said uncalibrated digital output including at least one clipped portion and at least one non-clipped portion;

estimating at least one parameter related to said analog input based, at least in part, on said uncalibrated digital output;

predicting at least one value corresponding to said at least one clipped portion based, at least in part, on said at least one non-clipped portion;

determining at least one value based, at least in part, on said at least one parameter, on said at least one non-clipped portion, and on said at least one predicted value corresponding to said at least one clipped portion;

accessing a correction memory using addresses that are responsive to another uncalibrated digital output; and outputting a calibrated digital output from said correction memory based on said step of accessing.

25. A calibrator for an analog-to-digital converter, said analog-to-digital converter converting an analog input to a digital output, comprising:

an estimator adapted to estimate at least one parameter related to said analog input based, at least in part, on said digital output;

a non-linear processor adapted to predict values corresponding to at least one clipped portion of said digital output;

a filter adapted to utilize said at least one parameter related to said analog input and an output of said non-linear processor to reconstruct said analog input digitally; and a table generator adapted to calculate correction table entries based, at least partly, on the digitally reconstructed analog input and said digital output.

26. A method for calibrating analog-to-digital conversion, comprising the steps of:

providing an analog input having an amplitude at a first level, said first level not exceeding a full scale swing of the analog-to-digital conversion;

converting said analog input to a first uncalibrated digital output;

estimating at least one parameter related to said analog input based, at least in part, on said first uncalibrated digital output;

increasing said amplitude of said analog input to a second level, said second level exceeding said full scale swing of the analog-to-digital conversion;

converting said analog input to a second uncalibrated digital output, said second uncalibrated digital output including at least one clipped portion and at least one non-clipped portion;

predicting at least one value corresponding to said at least one clipped portion based, at least in part, on said at least one non-clipped portion; and determining at least one value based, at least in part, on said at least one parameter, on said at least one non-clipped portion, and on said at least one predicted value corresponding to said at least one clipped portion.

* * * * *

UNITED STATES PATENT AND TRADEMARK OFFICE
CERTIFICATE OF CORRECTION

PATENT NO. : 6,407,685 B1
DATED : June 18, 2002
INVENTOR(S) : Peter Händel et al.

It is certified that error appears in the above-identified patent and that said Letters Patent is hereby corrected as shown below:

Column 3,
Line 28, replace "thereof. other" with -- thereof. Other --
Line 60, replace "improved Linearity" with -- improved linearity --

Column 6,
Line 45, replace "Incrementally during" with -- incrementally during --

Column 9,
Line 33, replace "present invent on are illustrated" with -- present invention are illustrated --
Line 46, replace "S.-P." with -- S.-H. --

Column 11,
Line 21, replace "20 $\log_{1c}2 \approx 6$ dB." with -- 20 $\log_{10}2 \approx$ 6dB. --
Line 30, replace "1=0 to L" with -- $\ell$=0 to L --

Column 16,
Lines 35-36, replace "x(1)=s(1) for 1<k and x(1)=Uu for 1≥k. Then, $\hat{s}$(1) for 1=k, k+1,..."
With --x($l$)=s($l$) for $l$<k and x($l$)=Uu for $l$≥k. Then, $\hat{s}$($l$) for $l$=k, k+1,...--
Line 47, replace "(1=0,...,L)" with -- ($l$=0,...,L) --

Column 17,
Lines 10-11, Equation 30, replace
"$$L = \begin{pmatrix} \cos w ... \cos(L+1)w \\ \sin w ... \sin(L+1)w \end{pmatrix} \quad Pp = \begin{pmatrix} \cos(1-p)w \\ \sin(1-p)w \end{pmatrix}$$"

with -- $NG = \sum_{\ell=0}^{L} (c_\ell^p)^2$ --

UNITED STATES PATENT AND TRADEMARK OFFICE
CERTIFICATE OF CORRECTION

PATENT NO.   : 6,407,685 B1
DATED        : June 18, 2002
INVENTOR(S)  : Peter Händel et al.

It is certified that error appears in the above-identified patent and that said Letters Patent is hereby corrected as shown below:

Column 17, cont'd,
Table 3, line 49, insert --

$$\text{prediction: } \hat{s}(k) = \sum_{l=0}^{L} C_l^p \bar{s}(k-p-l)$$

--

Column 18,
Line 52, replace "p-1" with -- p=1 --

Column 20,
Line 33, replace "oarallel lead lines, etc.)" with -- parallel lead lines, etc.) --

Column 21,
Line 31, replace "ore parameter" with -- one parameter --

Signed and Sealed this

Thirtieth Day of September, 2003

JAMES E. ROGAN
*Director of the United States Patent and Trademark Office*